United States Patent
Michimata et al.

(10) Patent No.: US 8,278,935 B2
(45) Date of Patent: Oct. 2, 2012

(54) PROBE RESISTANCE MEASUREMENT METHOD AND SEMICONDUCTOR DEVICE WITH PADS FOR PROBE RESISTANCE MEASUREMENT

(75) Inventors: Shigetomi Michimata, Kanagawa (JP); Masayuki Yanagisawa, Kanagawa (JP); Kazumasa Kuroyanagi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 572 days.

(21) Appl. No.: 12/078,781

(22) Filed: Apr. 4, 2008

(65) Prior Publication Data

US 2009/0008641 A1   Jan. 8, 2009

(30) Foreign Application Priority Data

Apr. 5, 2007  (JP) .............. 2007-099090
Mar. 14, 2008  (JP) .............. 2008-065625

(51) Int. Cl.
*G01R 31/08* (2006.01)
*G01R 31/00* (2006.01)

(52) U.S. Cl. ............ 324/525; 324/750.16
(58) Field of Classification Search .......... None
See application file for complete search history.

(56) References Cited

U.S. PATENT DOCUMENTS

| | | | |
|---|---|---|---|
| 5,554,940 A * | 9/1996 | Hubacher | 324/762.03 |
| 5,923,047 A * | 7/1999 | Chia et al. | 257/48 |
| 6,844,631 B2 * | 1/2005 | Yong et al. | 257/786 |
| 7,061,256 B2 | 6/2006 | Hasegawa | |
| 7,115,985 B2 * | 10/2006 | Antol et al. | 257/700 |
| 2006/0028221 A1 | 2/2006 | Hasegawa | |
| 2007/0054199 A1 | 3/2007 | Wakabayashi | |

FOREIGN PATENT DOCUMENTS

| | | |
|---|---|---|
| JP | 08-082657 | 3/1996 |
| JP | 11-039898 | 2/1999 |
| JP | 11-352151 A | 12/1999 |
| JP | 2001-343426 A | 12/2001 |
| JP | 2003-59987 A | 2/2003 |
| JP | 2004-085377 A | 3/2004 |
| JP | 2004-119774 A | 4/2004 |
| JP | 2005-049314 A | 2/2005 |
| JP | 2006-038599 A | 2/2006 |
| JP | 2006-059895 A | 3/2006 |
| JP | 2007-067327 A | 3/2007 |

* cited by examiner

*Primary Examiner* — Roberto Velez
(74) *Attorney, Agent, or Firm* — Foley & Lardner LLP

(57) ABSTRACT

A probe resistance measuring method includes measuring first resistances at three or more nodes by making contact at least a part of a plurality of probes of a probe unit with three or more pads for resistance measurement based on a first correspondence relation. The measured resistances are stored as a first measurement result and contact resistances of the plurality of probes of the probe unit are calculated based on the first measurement result.

1 Claim, 26 Drawing Sheets

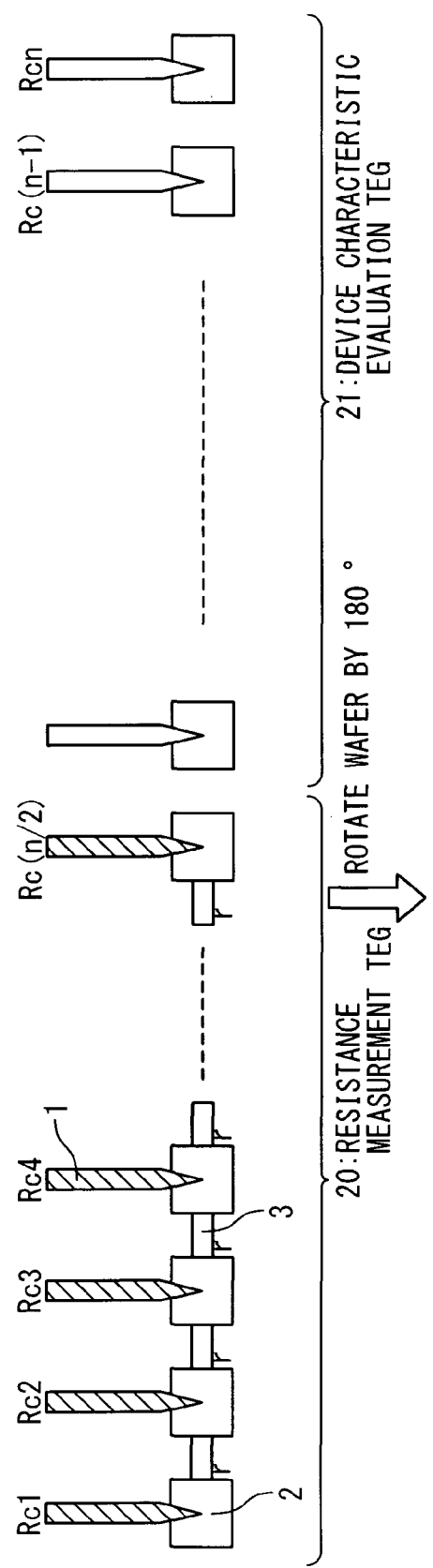

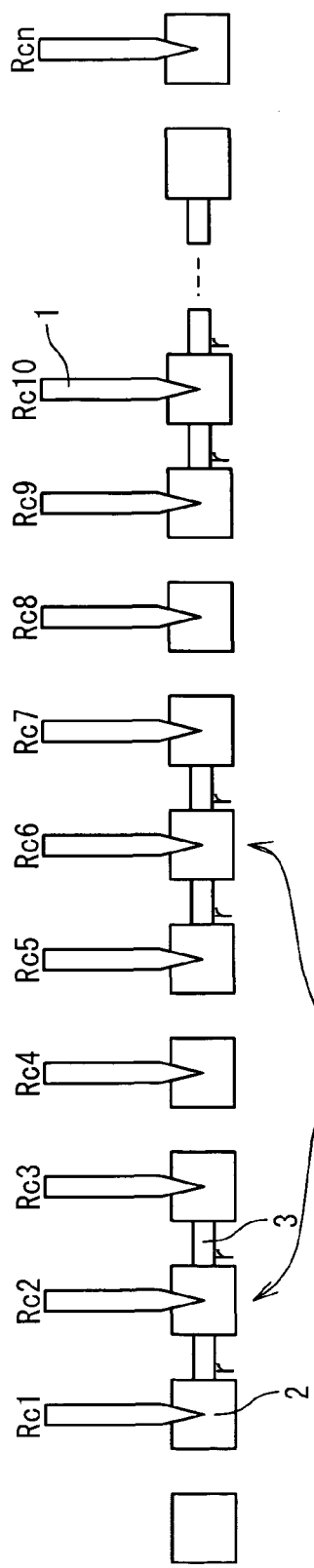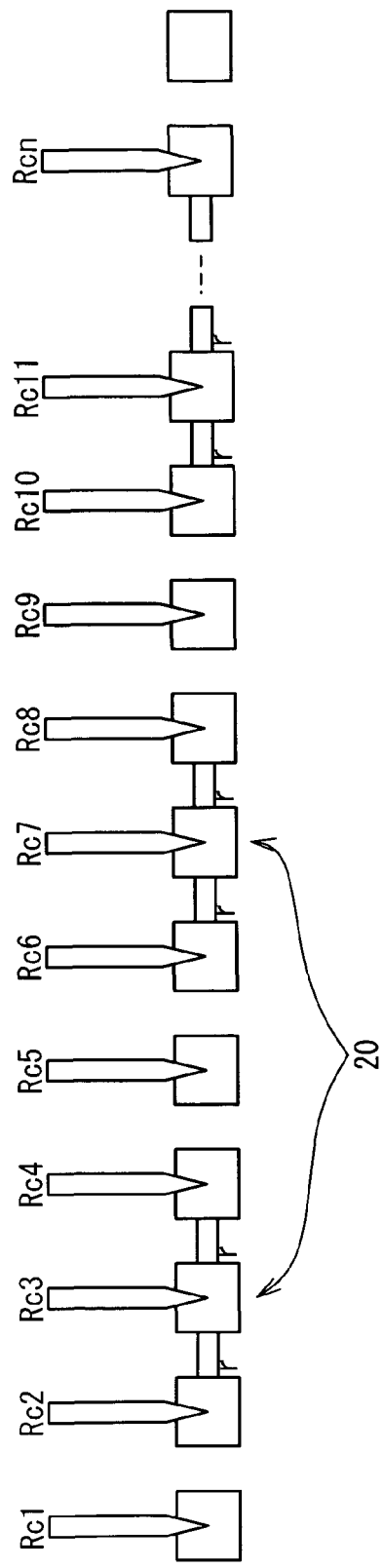

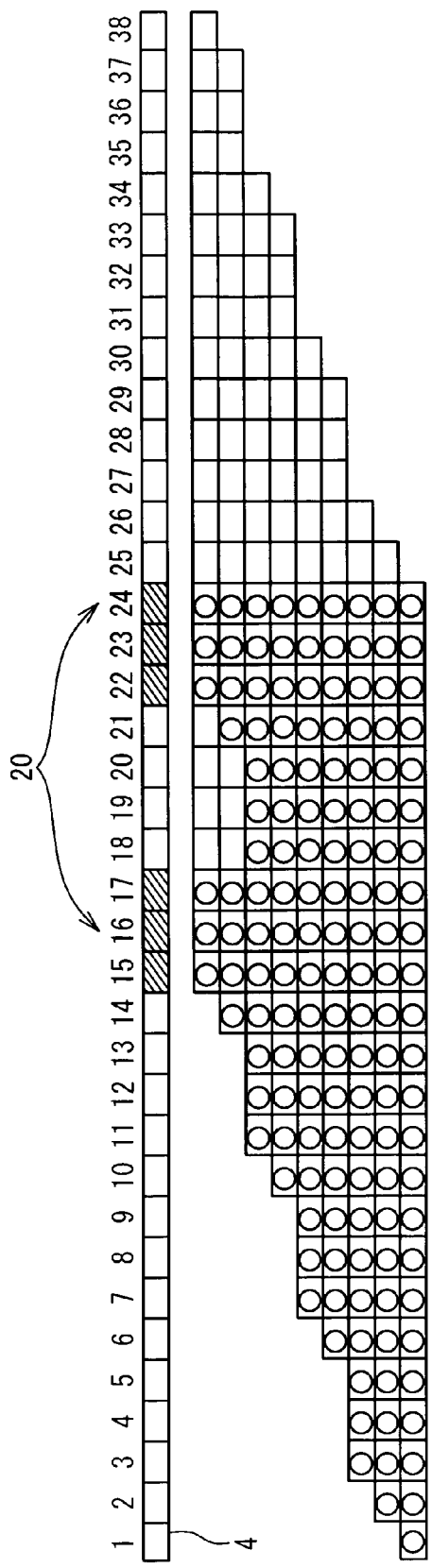

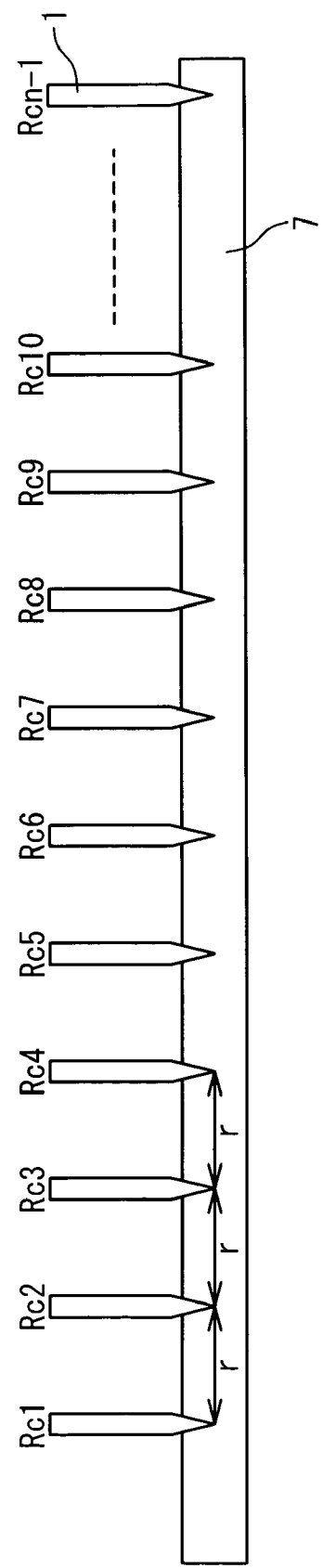
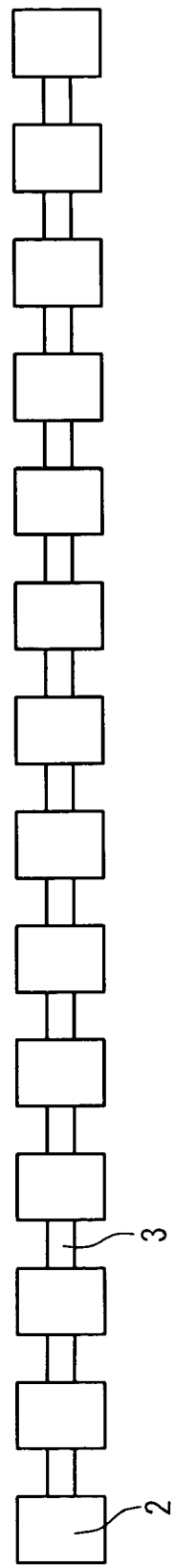

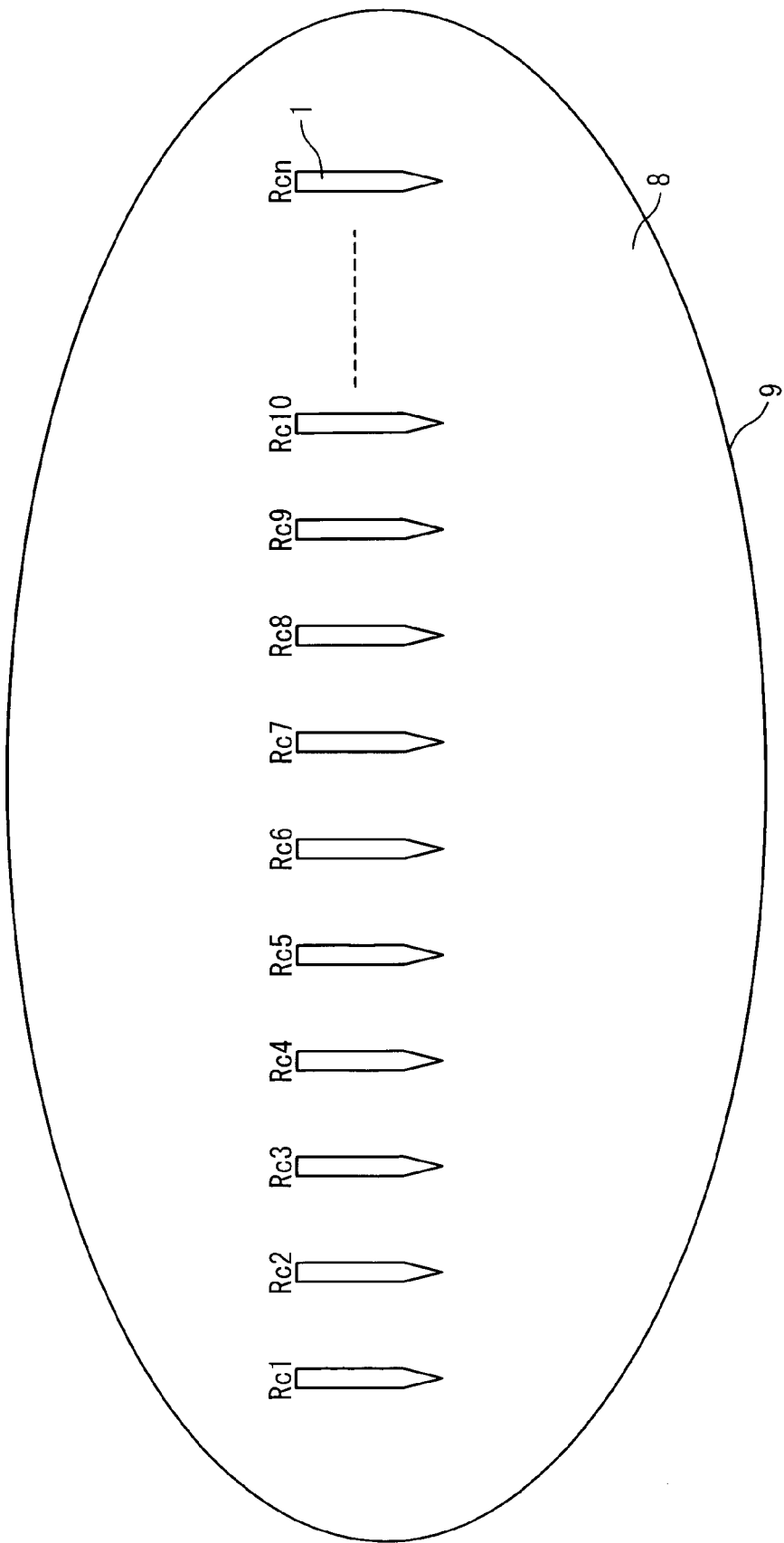

PROBE RESISTANCE MEASUREMENT METHOD AND SEMICONDUCTOR DEVICE WITH PADS FOR PROBE RESISTANCE MEASUREMENT

BACKGROUND OF THE INVENTION

1. Field of the Invention

The present invention is relates to a technique for evaluating electric characteristics of a device. This US patent application is based on Japanese Patent application Nos. 2007-099090 and 2008-065625. The disclosure thereof is incorporated herein by reference.

2. Description of Related Art

In order to evaluate the electric characteristics of a device, a method of making probes contact pads to measure a resistance between wiring lines is carried out. At this time, a contact resistance of the probe influences the measurement resistance. With influence of the probe contact resistance on an automatic measuring apparatus, even if an unnecessary resistance is added to the probe in the form of contamination to shift the electric characteristics a little bit, the measurement value falls within a manufacturing deviation and any problem is not caused.

However, recently, it is required to reduce the deviation with the finer processing. Accordingly, it is impossible to meet the measurement requisition only by an open/short check and a rough check of resistance between pads.

In an LSI with a high performance, recently, a sort process using not voltage but current is performed in the sort process in which a test of a MOSFET for characteristic monitor provided onto a product wafer is carried out. In this sort process, the sort is performed based on a threshold voltage Vth of the MOSFET but an ON current of the MOSFET. The threshold voltage sort is performed by measuring a small current in the order of microampere but the ON current sort is performed by measuring a current in the order of milliampere which is relatively large. Therefore, when a contact resistance of about 10Ω is attached to the probe, a voltage drop due to the contact resistance cannot be ignored, because the current reduces at a considerable rate. Thus, the sort is influenced based on the contact resistance. Also, in order to meet the strict sort rule, the measurement deviation cannot be ignored. Therefore, it is necessary to always keep the contact resistance of the probe to a low resistance. Ideally, the contact resistance of each probe must be kept to be equal to or less than 1Ω. Thus, a technique of measuring the contact resistance of the probe is demanded. Especially, the technique that can measure contact resistances of n (n≧3) probes is demanded.

In conjunction with the above description, a method of measuring a contact resistance of a probe is described in Japanese Patent Application Publication (JP-P2004-85377A: first related art). In this measuring method, a plurality of electrode pads connected with a wiring line is provided for a semiconductor device for an electric test to be carried out about. In this method of measuring a contact resistance, a current is supplied to the probe and a voltage is measured. Thus, the contact resistances of the whole probes are determined from the supplied currents and the measured voltages. Also, in a technique described in this first related art, it is not possible to measure the contact resistance of each probe precisely.

Japanese Patent Application Publication (JP-P2001-343426A: second related art) discloses a method of testing a semiconductor device. In this method, an impedance in a current path between two pads to which two probes are made contact is measured, and when the measured value is larger than a predetermined value, the probe is cleaned. However, in this method, the contact resistances of all the probes are not measured and cannot be determined.

Also, Japanese Patent Application Publication (JP-A-Heisei 8-82657: third related art) discloses a method of testing an integrated circuit device. In this method, a contact state of probes with a first pad section and a second pad section is detected. The first pad section is composed of a plurality of electrodes and the second pad section is composed of a plurality of electrodes having different resistances. In this technique, a resistance between two pads, a contact state and needle pressure can be detected, but the contact resistance of each probe cannot be determined precisely.

Also, Japanese Patent Application Publication (JP-A-Heisei 11-39898: fourth related art) discloses a semiconductor device. In this technique, a contact state of a probe group can be checked but the contact resistance of each probe cannot be determined precisely.

Also, Japanese Patent Application Publication (JP-P2004-119774A: fifth related art) discloses a semiconductor device. In this technique, a signal is given from a switching element so as to supply a voltage to an external connection pad. At this time, a contact check result to a pad is outputted based on a voltage appearing on a monitor pad.

Also, Japanese Patent Application Publication (JP-P2006-59895A: sixth related art) discloses a method of checking a conduciveness of a contact plug or via-plug. Many checking pads are arranged and the check is performed by using these pads.

SUMMARY

In a first aspect of the present invention, a probe resistance measuring method includes measuring first resistances at three or more nodes by making contact at least a part of a plurality of probes of a probe unit with three or more pads for resistance measurement based on a first correspondence relation; storing the measured first resistances as a first measurement result; and calculating contact resistances of the plurality of probes of the probe unit based on the first measurement result.

In a second aspect of the present invention, a semiconductor device with pads for probe resistance measurement, includes three or more pads electrically isolated from a semiconductor circuit formed on a semiconductor substrate; and wiring lines provided to connect between the pads in series and having a same resistance.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 8A and 8B are diagrams showing a method of measuring the contact resistance of the probes while rotating a wafer;

FIGS. 10B-1 and 10B-2 are diagrams showing a method of measuring contact resistances of probes of a probe unit by using a TEG with three or more pads connected in series;

FIGS. 11A and 11B are diagrams showing the method of measuring the contact resistance of each probe of the probe unit of 24 probes by using a TEG for contact resistance measurement of three pads connected in series;

FIGS. 12A and 12B are diagrams showing a pad for resistance measurement as a linear wiring line pattern;

FIG. 13 is a diagram showing a method of measuring the contact resistance of each probe of the probe unit of many probes by using a large area pad for resistance measurement;

DETAILED DESCRIPTION OF THE PREFERRED EMBODIMENTS

Hereinafter, a probe resistance measurement method and a semiconductor device of embodiments of the present invention will be described in detail with reference to the attached drawings.

First Embodiment

Figure 7A:
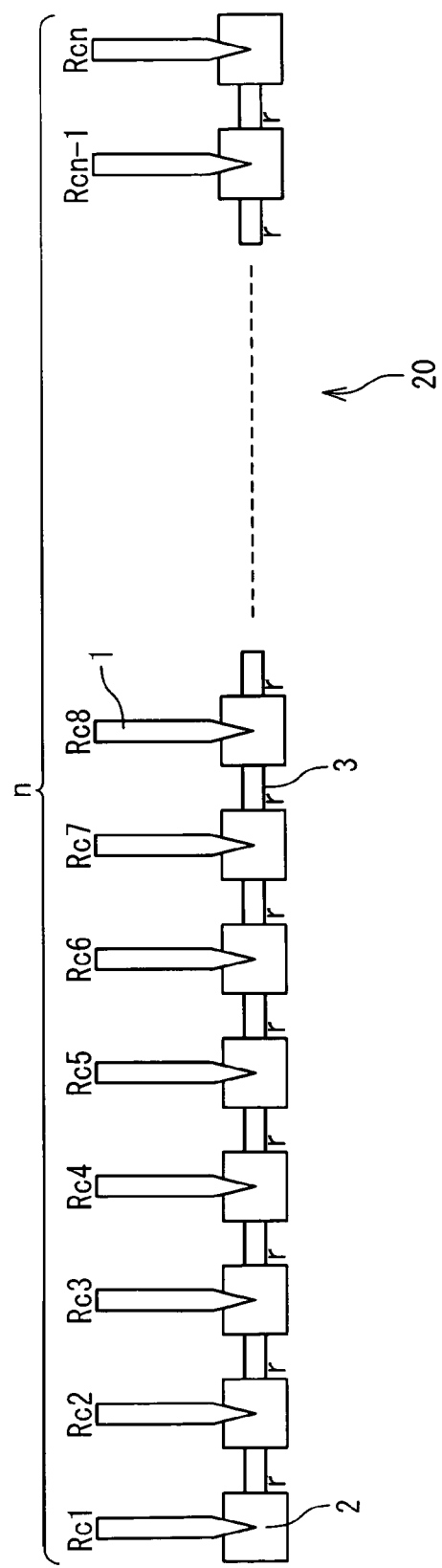
FIG. 7A is a diagram showing a probe unit having n (n≧3) probes in the present invention.

FIG. 7A is a diagram showing a probe unit having n ($n \geq 3$) probes. As shown in FIG. 7A, m ($m \geq 3$, and it is not necessary to be n=m) pads connected in series are provided for the probe unit having the n probes. A test element group (hereinafter, to be referred to as a TEG) 20 for contact resistance measurement is arranged in which resistances between the pads 2 (resistances of wiring lines 3) are equal to each other. The contact resistance of each of the n probes 1 is measured by the probe unit and the pads 2. The measured contact resistance contains the resistance of a resistor from the tip of probe 1 to a wiring line of a device through the probe unit.

(a) Case of $n \geq 4$ and $n \leq m$

Numbers 1, 2, 3 . . . are allocated to the pads 2 in order from the pad 2 arranged at the end of the TEG 20 for contact resistance measurement. First, the four pads 2 connected in series and having the numbers 1 to 4 are selected. The measured resistances between No. 1 and No. 2, between No. 2 and No. 3, between No. 1 and No. 3, between No. 3 and No. 4, and between No. 2 and No. 4 are supposed to be R12, R23, R13, R34, R24, respectively. Also, the contact resistances of the four probes 1 to the pads 2 assigned with Nos. 1, 2, 3, and 4 are supposed to be Rc1, Rc2, Rc3, and Rc4, respectively.

For example, it is supposed that the probes 1 and the pads 2 are arranged at a same pitch. Also, supposing that the wiring resistance between the adjacent pads 2 is r (which is constant), the following relation is satisfied:

$$R12 = Rc1 + Rc2 + r$$

$$R23 = Rc2 + Rc3 + r$$

$$R13 = Rc1 + Rc3 + 2r$$

$$R34 = Rc3 + Rc4 + r$$

$$R24 = Rc2 + Rc4 + 2r$$

Solving these equations about Rc1 to Rc4, the following relations are calculated:

$$Rc1 = (2R12 - R23 + R34 - R24)/2$$

$$Rc2 = (R12 + R23 - R13)/2$$

$$Rc3 = (R23 + R34 - R24)/2$$

$$Rc4 = (2R34 - R23 + R12 - R13)/2$$

Thus, the contact resistance of each of four probes 1 is obtained.

In this way, by measuring the resistances between four pads 2 connected in series, the contact resistances of the four probes 1 which are respectively made contact with the four pads 2 are measured. In the same way, the contact resistances of the n probes 1 can be measured by measuring the resistances between the four pads 2 in order over the n probes 1. In a layout shown in FIG. 7A, by measuring the resistances between the four pads, the contact resistances of all the n probes 1 are determined.

(b) Case of $n \geq 4$ and m=4

An example will be described in which the contact resistances of the n probes 1 of the probe unit are measured by using the TEG 20 for contact resistance measurement composed of four pads 2 connected in series. At this time, it is supposed that each of a plurality of sets of four probes of the n probes 1 of the probe unit is arranged to be made contact with the four pads 2.

By measuring the resistances between the four pads 2 connected in series, the contact resistances of the four probes 1 of each set which are respectively made contact with the four pads are measured. This operation is same as the above-mentioned first example (a).

Next, by making the four probes 1 of another set contact with the four pads 2 connected in series, the contact resistances of the four probes 1 of the other set are measured. This operation is repeated such that the four probes 1 of each set are made contact with the four pads 2. Thus, the contact resistances of all the n probes 1 can be measured.

It should be noted that as one example of (a) case of n≧4 and n≦m and (b) case of n>4 and m=4, the embodiments have been described in which the contact resistances of the n probes are measured by repeating the above operation for every four probes 1. However, the value of m is not 4 but may be 5 or more. That is, the five or more proves of every set may be respectively made contact with the five or more pads 2. In this case, the contact resistances of the n probes 1 can be calculated by solving the measured resistances between pads 2 about the contact resistances.

The above contact resistance is calculated under the assumption that the wiring resistance r between adjacent pads 2 is a constant value r. However, actually, an error of the wiring resistance from the constant value is expected to be present. Supposing that the differences of the wiring resistances between pads 2 of the numbers 1 and 2, between pads 2 of the numbers 2 and 3, between pads 2 of the numbers 3 and 4 from the constant value r are αr, βr, and γr, respectively, the following equations are met.

$$R12=Rc1+Rc2+(1+\alpha)r$$

$$R23=Rc2+Rc3+(1+\beta)r$$

$$R13=Rc1+Rc3+(2+\alpha+\beta)r$$

$$R34=Rc3+Rc4+(1+\gamma)r$$

$$R24=Rc2+Rc4+(2+\beta+\gamma)r$$

Solving these equations about Rc1 to Rc4, the following solutions are obtained:

$$Rc1=(R12-R23+R13)/2-r-\gamma r$$

$$Rc2=(R12+R23-R13)/2$$

$$Rc3=(R23+R34-R24)/2$$

$$Rc4=(R34-R23+R24)/2-r-\gamma r$$

That is, Rc2 and Rc3 are not affected by the errors of wiring resistances r, and the wiring resistance differences of −αr and −γr are added to Rc1 and Rc4, respectively. For example, supposing that r<1Ω (α~10%, γ~10%), and about 10% of deviation is generated as a whole in the width, length, film thickness and material resistivity of the wiring line, the wiring resistance difference added to Rc1 or Rc4 is about 0.1Ω or less. In actual, since the width and length of the wiring line between adjacent pads 2 are a few of tens micrometers which is sufficiently long and it is possible to set a distance between the pads 1 to 4 to a few of hundreds micrometers at most, there is no case that the wiring resistance has a large deviation of 10%, including dependency on the film thickness and the resistivity. Accordingly, when the contact resistance is made equal to or less than 1Ω, it is possible to assume that r is constant, since r because it is possible to ignore the deviation of r.

(c) Case of n=3 and m=3

Figure 7B:
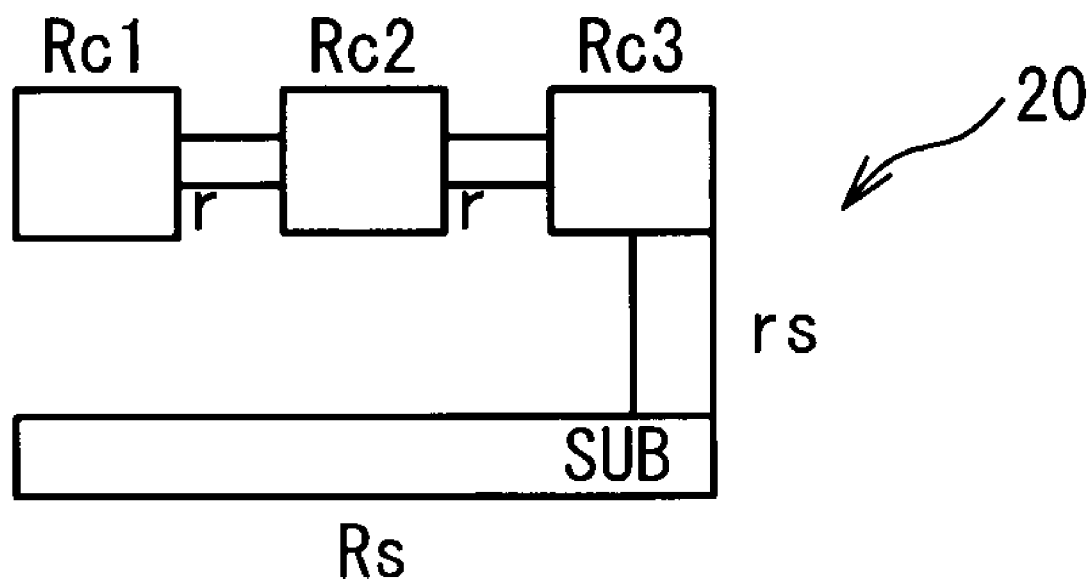
FIG. 7B is a diagram showing a TEG for contact resistance measurement in case of the probe unit of three probes.

In case of the probe unit composed of three probes 1 (n=3), the contact resistance is measured by a method different from the above. A terminal for a chip substrate is used. As shown in FIG. 7B, by using the TEG 20 for contact resistance measurement composed of three pads 2 connected in series and one pad 2 (pad 2 with No. 3) connected with the chip substrate (shown with SUB), the contact resistances of all of the three probes 1 can be measured. Supposing that Rs is the contact resistance of the terminal for the chip substrate, rs is an internal resistance between the pad 2 with No. 3 and the chip substrate, and R1s, R2s and R3s are measured resistance between the terminal for the chip substrate and the pads 2 with Nos. 1, 2, 3, respectively, the following equations are established:

$$R12=Rc1+Rc2+r$$

$$R23=Rc2+Rc3+r$$

$$R13=Rc1+Rc3+2r$$

$$R3s=Rc3+Rs+rs$$

$$R2s=Rc2+Rs+r+rs$$

$$R1s=Rc1+Rs+2r+rs$$

Solving these equations with respect to Rc1, Rc2, and Rc3, the following contact resistances are obtained:

$$Rc1=(2R12-R23+R3s-R2s)/2$$

$$Rc2=(R12+R23-R13)/2$$

$$Rc3=(R23+R3s-R2s)/2$$

(d) Case of n>3 and m=3

In the above (c), the embodiment is shown in which the contact resistances of the three probes 1 (n=3) of the probe unit are measured. However, if the TEG 20 for contact resistance measurement is used which is composed of the above-mentioned three pads 2 connected in series and one pad 2 connected with the chip substrate, the contact resistances of all the n (n>3) probes 1 of the probe unit can be measured without being limited to the three probes 1. In this case, it is assumed that the probe unit has the n probes 1 for the contact resistance to be measured and the n probes are arranged for every three probes 1 which are respectively made contact with the three pads 1 connected in series. That is, the sets of the 3 probes 1 are sequentially made contact with the three pads of the TEG 20 connected in series to measure the contact resistances of the probes 1. Thus, the contact resistances of the n probes 1 can be measured.

As shown in the cases (a), (b), (c), and (d), the contact resistances of the three or more probes can be measured by using the TEG 20 for contact resistance measurement laid out in such a manner that the resistances between the adjacent pads (the resistances of the wiring line 3) are equal, and having three or more pads connected in series. By repeating measurement in order, the contact resistances of all the n probes 1 can be measured.

In this case, it is desirable that the wiring line 3 is formed of a material having a low resistance such as aluminum. Also, the width, length, film thickness and the resistivity of the material of the wiring line are selected for the wiring resistances between the adjacent pads 2 to be equal to each other. Specifically, it is desirable to select the width, length, film thickness and resistivity of the material of the wiring line such that the resistance is less than a few ohms. If the wiring resistances between the adjacent pads 2 are equal to each other, the width, length, film thickness and resistivity of material of the wiring line 3 may be different. Also, the wiring line 3 may be formed of a combination of a plurality of wiring materials.

The contact resistance of probe 1 in this case contains the resistance from the inside of the probe unit to the tip of probe 1 and the resistance of the wiring line of a semiconductor chip to be measured.

It is possible to calculate the contact resistance based on the algorithm of the auto control system immediately after the measurement. That is, in the example of FIG. 7A, numbers of 1, 2, . . . are assigned to the pads 2 from the pad 2 located at the end of the TEG 20 for contact resistance measurement. With respect to the pads 2 with Nos. 1 to 4 connected in series, the resistances R12, R23, R13, R34, and R24 between the pad 2 with No. 1 and the pad 2 with No. 2, between the pad 2 with No. 2 and the pad 2 with No. 3, between the pad 2 with No. 3 and the pad 2 with No. 4, and between the pad 2 with No. 3 and the pad 2 with No. 4 are measured, and the contact resistances Rc1, Rc2, Rc3, and Rc4 of the probes 1 are calculated from the measured resistances in accordance with correspondence relation of the pads 2 and the probes 1. In the same manner, the resistances of a next set of the four probes 1 are measured and the contact resistances are calculated from the measured resistances in accordance with correspondence relation of the pads 2 and the probes 1. Thus, the contact resistances of all then probes 1 are calculated. A process can be automatically executed of comparing the calculated contact resistance with a predetermined reference and determining whether or not each probe 1 is in a good state. Moreover, it is possible to automatically distinguish the probe that is determined to be not in the good state in order to perform a cleaning and maintenance operation to the probes 1.

Second Embodiment

Figure 8B:
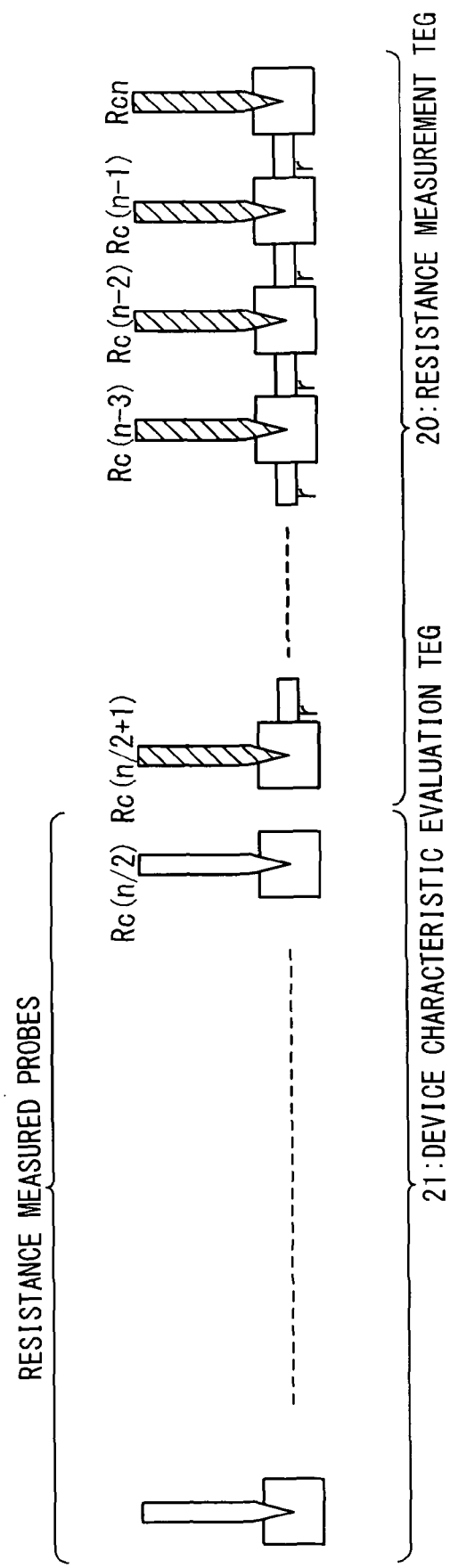

As shown in FIGS. 8A and 8B, it is possible to measure the contact resistances of the probes while rotating a wafer by 180 degrees. As shown in FIG. 8A, the TEG composed of n pads (n is an even number) is used in this embodiment. The TEG is composed of a TEG 20 for contact resistance measurement of the n/2 pads 2 from the one end and a TEG 21 for device characteristic evaluation of the n/2 pads from the other end. The structure of the TEG 20 for contact resistance measurement is same as that of the TEG shown in FIG. 7A.

First, n/2 of the n probes 1 are made contact with the TEG 20 for contact resistance measurement, and the contact resistances are measured by the method of described in the first embodiment. After that, by using the characteristic of an auto-prober, the wafer is rotated by 180 degrees and the remaining n/2 probes 1 are made contact with the TEG 20 for contact resistance measurement to measure the contact resistances. The contact resistances of all of the n probes 1 are measured through two steps by this method.

According to the second embodiment, the number of the pads 2 for the contact resistances to be measure can be reduced to a half of the probes 1, i.e., n/2. Therefore, the pads for the device electric characteristic evaluation can be arranged in the area left with the reduction of the number of pads. In other words, it is possible to attempt an effective utilization of the layout area.

Third Embodiment

Figure 9:
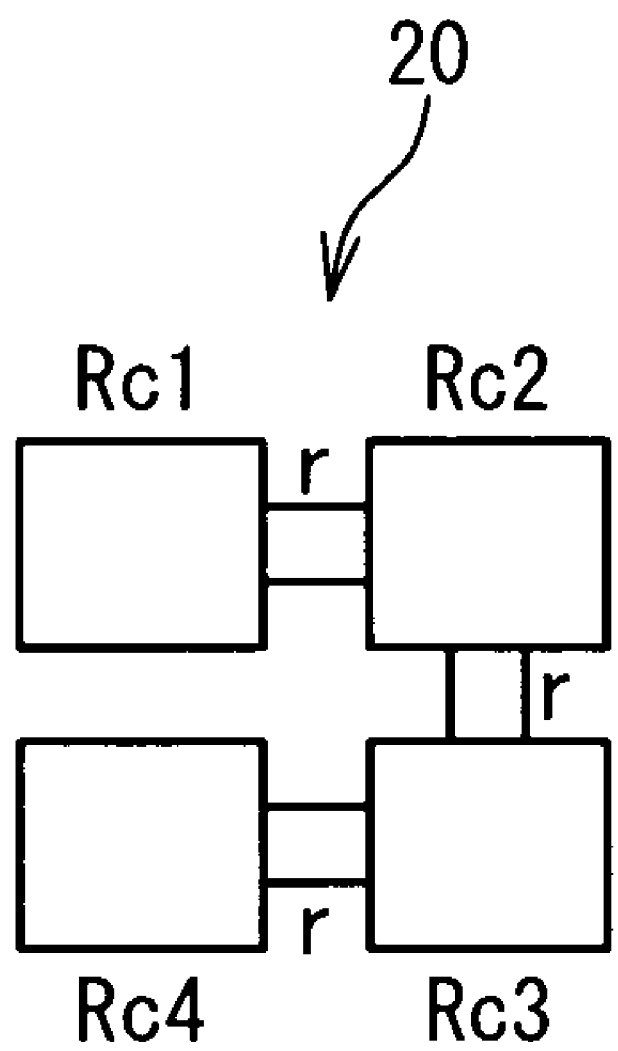
FIG. 9 shows an example of pads which are not arranged on a straight line.

As shown in FIG. 9, it is not necessary to arrange the pads 2 on a straight line and the pads 2 may be arranged on a curved line. By laying out the pads such that the resistances between adjacent pads 2 are equal to each other, the contact resistances of probes 1 can be measured, as in FIG. 7A.

Fourth Embodiment

Figure 1:
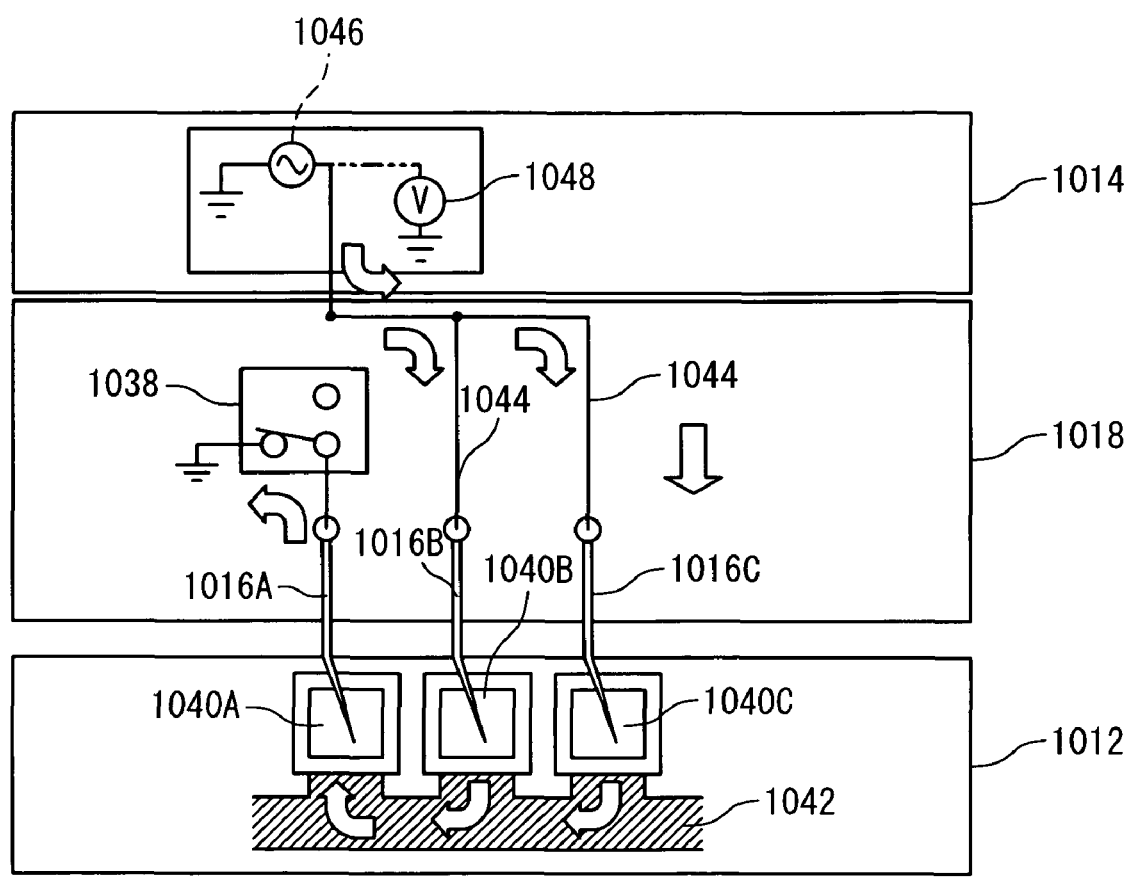
FIG. 1 is a diagram showing a measuring method in a related art.
Figure 2:
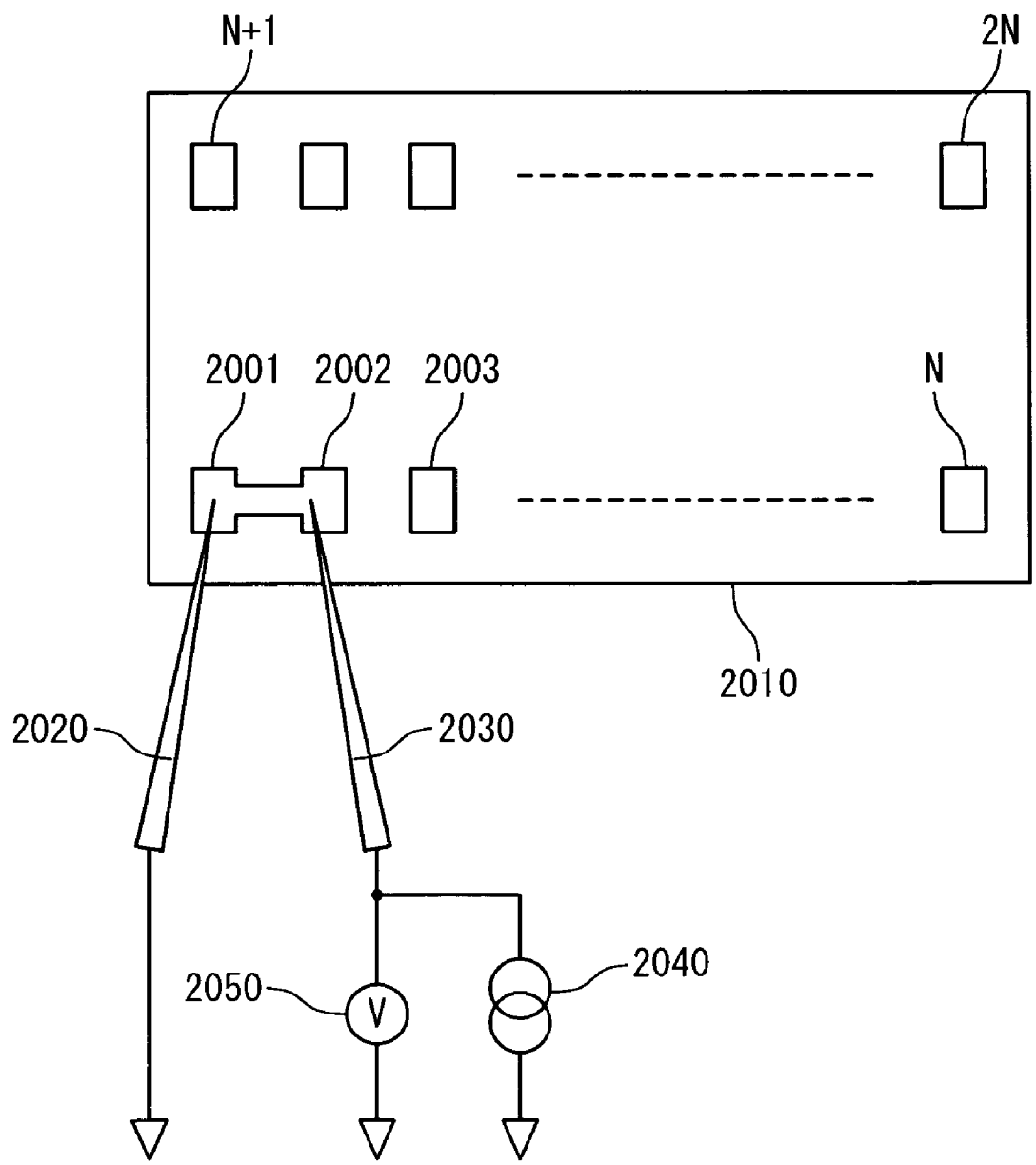
FIG. 2 is a diagram showing a measuring method in another related art.
Figure 3:
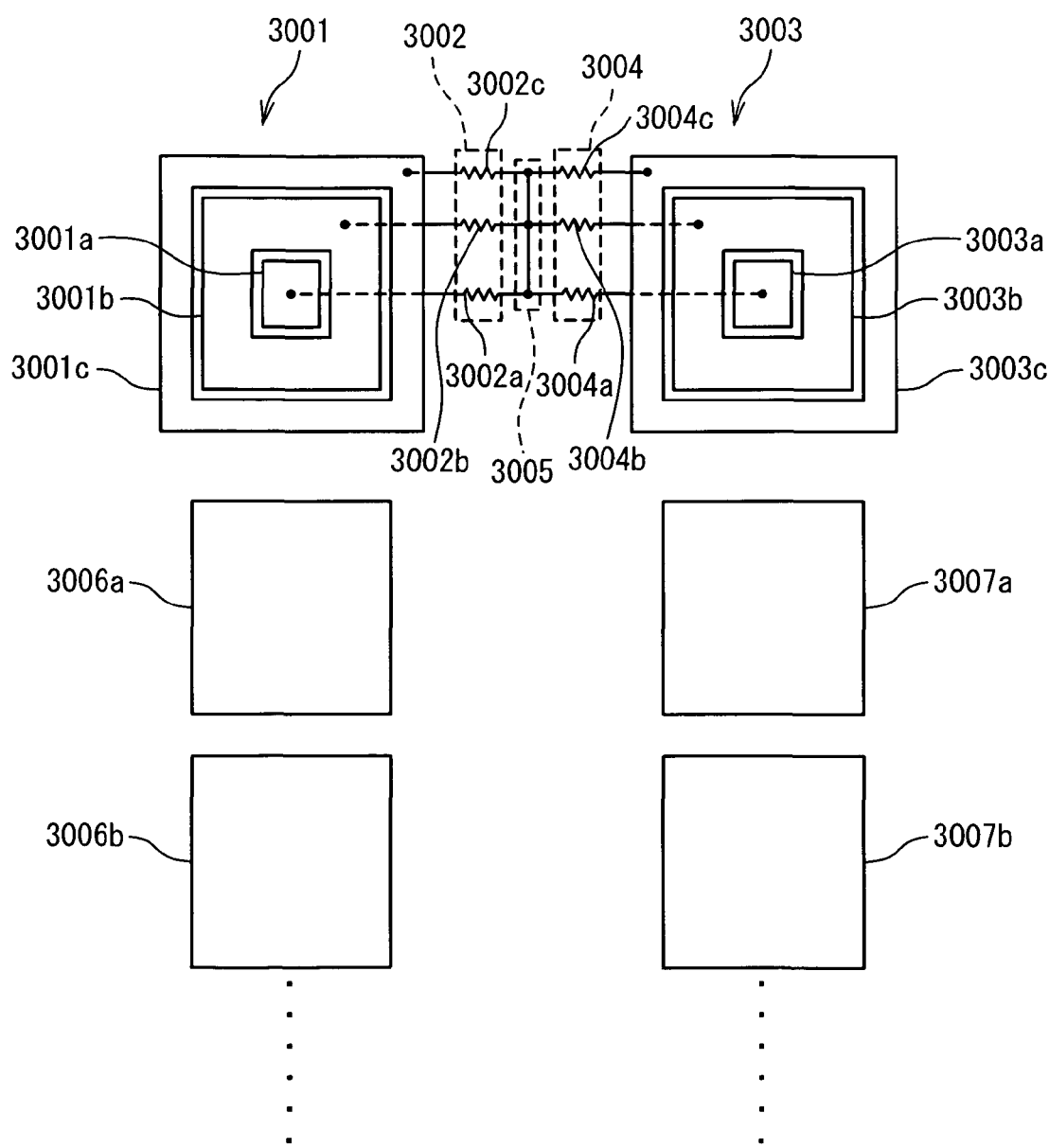
FIG. 3 is a diagram showing another related art.
Figure 4:
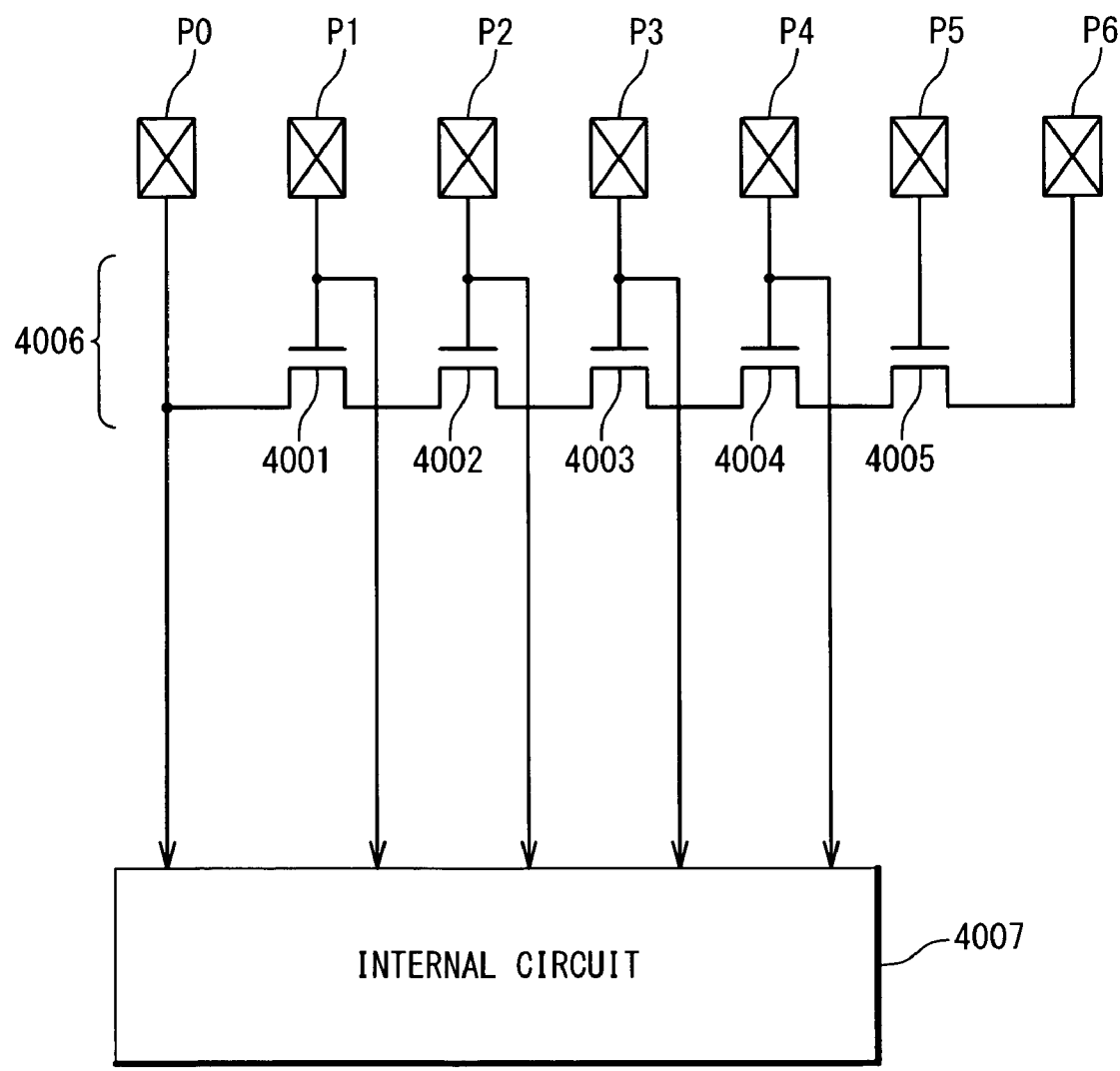
FIG. 4 is a diagram showing another related art.
Figure 5A:
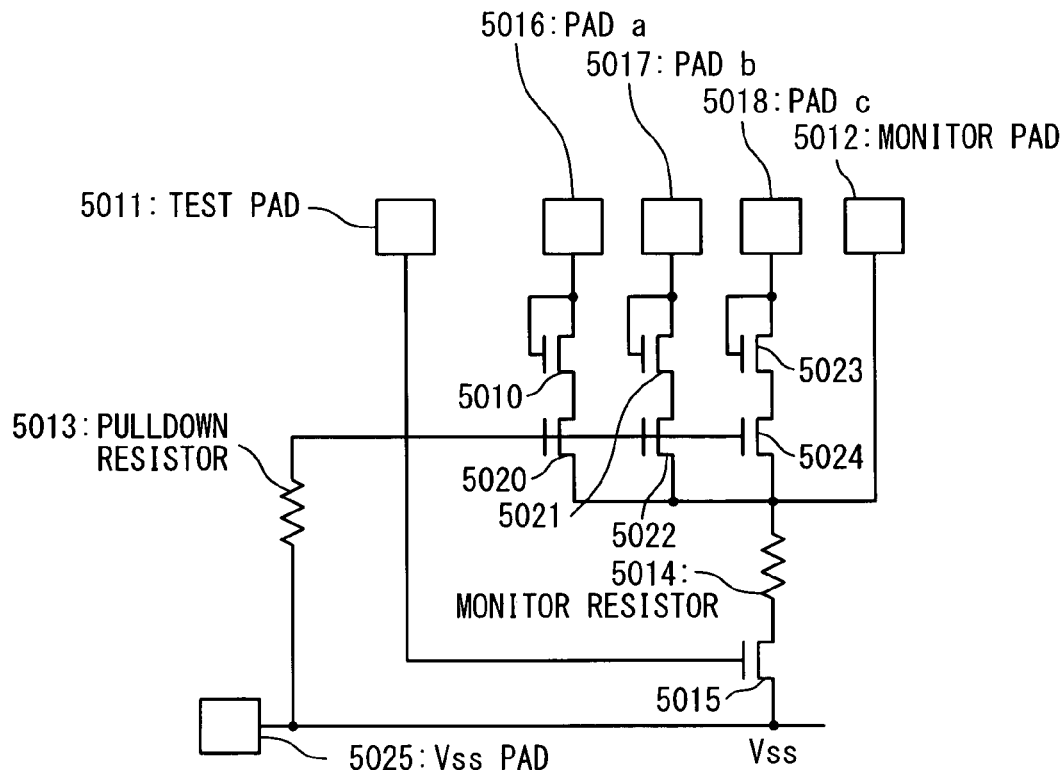
FIGS. 5A and 5B are diagrams showing another related art.
Figure 5B:
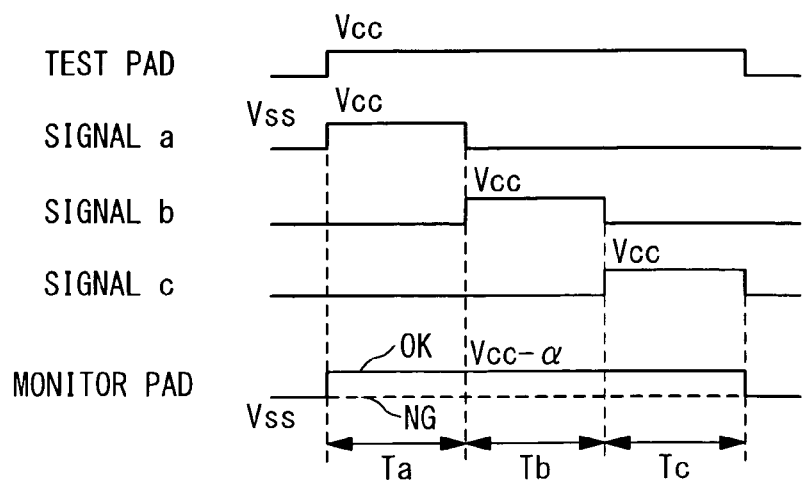
Figure 6A:
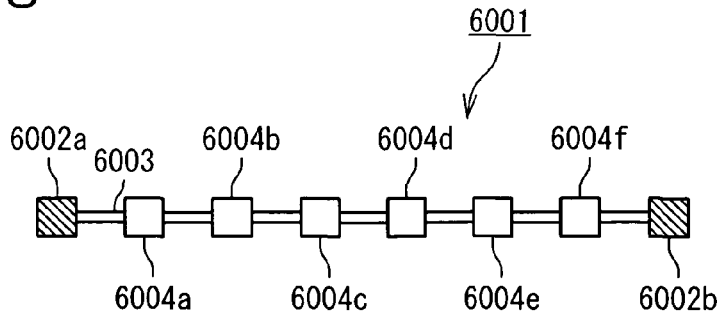
FIGS. 6A to 6C are diagrams showing another related art.
Figure 6B:
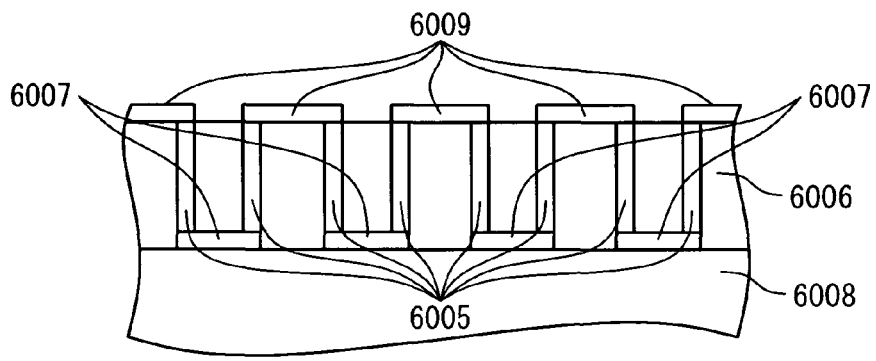
Figure 6C:
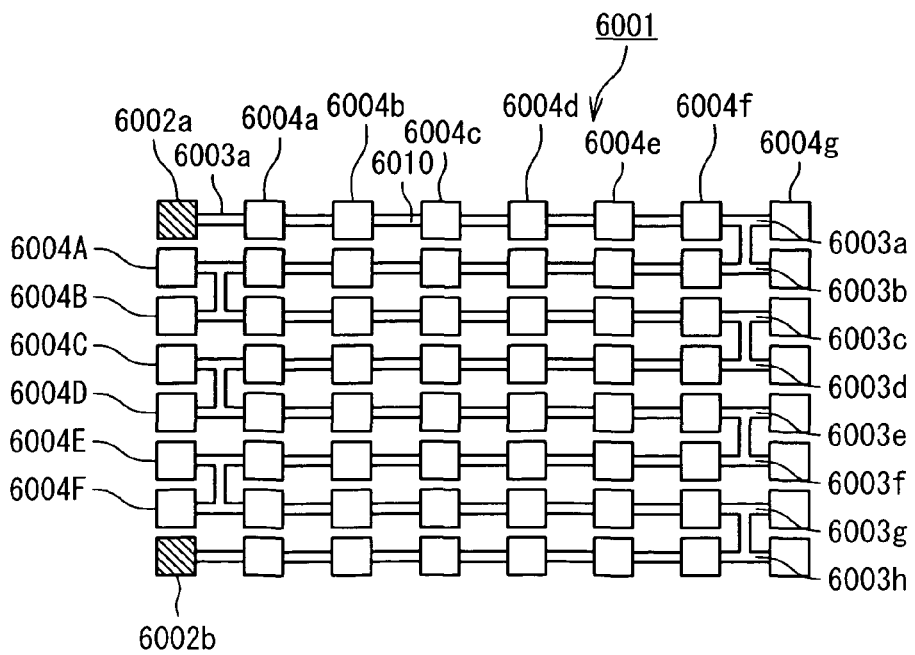
Figure 10A:
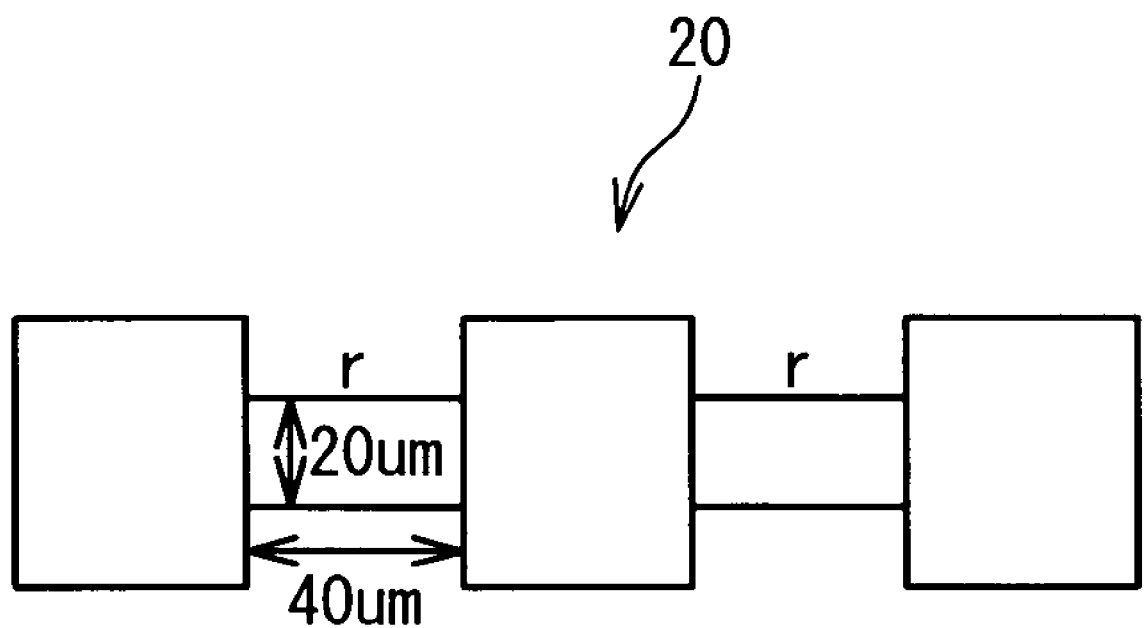
FIG. 10A is a diagram showing a TEG for contact resistance measurement containing three or more pads connected in series.

In this embodiment, the contact resistances are measured by use of a TEG 20 for contact resistance measurement composed of three or more pads 2 connected in series, as shown in FIG. 10A. As shown in FIGS. 10B-1 and 10B-2, the TEGs 20 for contact resistance measurement composed of three or more pads 2 connected in series and arranged in spaces between the pads for device electric characteristic evaluation. The contact resistance measurement of the probes 1 becomes possible by shifting the probes 1 to the wafer with the TEG composed of the TEG 20 for contact resistance measurement, or by rotating the wafer, and making the probes 1 contact the pads 2. When the probes 1 are shifted or rotated, the probes 1 are positioned on the corresponding pads 2. Thus, it is not necessary to provide a large area for the TEG 20 for contact resistance measurement and it is possible to measure the contact resistances of the probes 1.

While the probes 1 are arranged on the corresponding pads 1, the pads 2 may be the pads of the TEG 20 for contact resistance measurement or the pads for device electric characteristic evaluation. The pads may be dummy pads. Because the probes 1 can easily contact the pads by arranging the pads on the positions corresponding to the probes 1, a possibility that an influence is given to the precision of the probe 1 when the probes 1 contact another part other than the pad on the wafer, e.g., a passivation insulating film to protect a semiconductor circuit and so on can be excluded, and a suitable embodiment can be realized.

Various layouts of the pads (arrangement positions, the number of pads 2, the number of patterns, and so on) would be considered depending on the number of probes 1 to be used. Here, for convenience of the description, it is assumed that the TEG 20 for contact resistance measurement of three pads 2 connected in series is arranged every two pads. First, as shown in FIG. 10B-1, the probes 1 are made contacts and the resistances between the pads 2 are measured.

$R12 = Rc1 + Rc2 + r$ $R23 = Rc2 + Rc3 + r$ $R13 = Rc1 + Rc3 + 2r$

Next, as shown in FIG. 10B-2, the probes 1 are shifted for one pad 2 into the left direction, and the probes are made contact and the measurement is performed again. In this case, the direction and distance of a shift operation are dependent on the positions of the probes 1 at the start and the layout of the pads 2. At this time, strictly, the contact resistances Rc2 and Rc3 would be different in the first contact and the second contact. However, the difference in the contact resistance between the first contact and the second contact can be neglected in practice, when the difference is less than 0.1Ω. In this example, it is assumed that the contact resistances Rc2 and Rc3 are identical between the first contact and the second contact.

$R34 = Rc3 + Rc4 + r$ $R24 = Rc2 + Rc4 + 2r$

From the measurement through the second contact shown in FIG. 10B-2, the contact resistances Rc1, Rc2, Rc3, and Rc4 are calculated as follows.

$Rc1 = (2R12 - R23 + R34 - R24)/2$ $Rc2 = (12 + R23 - R13)/2$ $Rc3 = (R23 + R34 - R24)/2$ $Rc4 = (2R34 - R23 + R12 - R13)/2$

The contact resistances Rc5 to Rcn are also measured in the same way.

When the TEG 20 for contact resistance measurement of three pads 2 connected in series is arranged between two single pads, the contact resistances of all of the n probes 1 can be measured through twice contact and measurement. Depending on the number of probes 1 of the probe unit to be used and the arrangement position, number of arrangements of the TEG 20 for contact resistance measurement of three pads 2 connected in series, the condition of the total number of pads, including the TEGs 20 for contact resistance measurement, the number of times of the contact, a shift amount and rotation is determined.

Fifth Embodiment

Figure 11A:
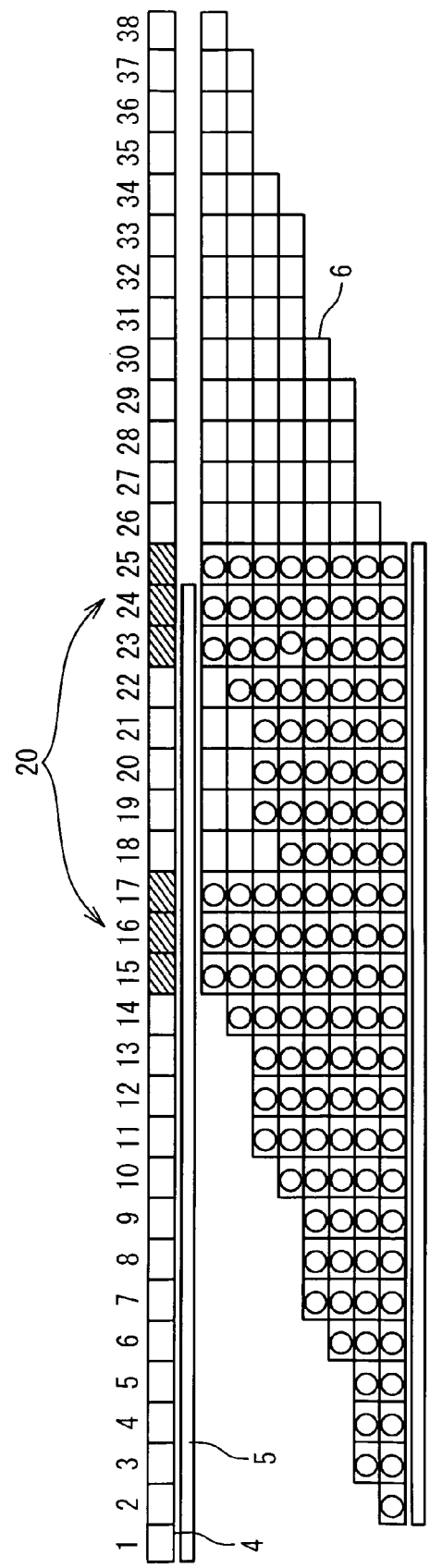

Referring to FIGS. 11A and 11B, in the probe unit of 24 probes 1, a method of measuring the contact resistance of each probe 1 with the TEG 20 for contact resistance measurement of three pads 2 connected in series as shown in the fourth embodiment will be described. In this embodiment, the TEG 20 for contact resistance measurement of three pads 2 connected in series is arranged on two positions in a central area of a TEG 4 of 38 pads.

An upper portion of FIG. 11A shows the arrangement of the pads. The two TEGs 20 for contact resistance measurement of three pads 2 connected series are arranged in the pad positions 15-17, and 23-25 of the TEG 4. A lower portion of FIG. 11A shows the position of probe unit 5 to the TEG 4. The uppermost line shows the position of the probe unit 5 in the first contact. Subsequently, the second line, the third line, ... show the positions of the probe unit 5 in the second contact, the third contact, respectively. A circle in a box indicates the contact of the probe 1 with any of the three pads 2 of the TEG 20 for contact resistance measurement. Through contact of eight times, it is possible to measure the contact resistances of all the 24 probes 1. FIG. 11B shows another example in which the position of the TEG 20 for contact resistance measurement of the three pads 2 connected in series is different. In this case, the contact resistances of all the 24 probes 1 can be measured through the contact of nine times.

Sixth Embodiment

FIG. 12A shows a pad 7 for resistance measurement of a linear shape wiring line pattern having a width of a pad size. Even if such a pad 7 for resistance measurement is used, it is possible to measure the contact resistances. Supposing that the film thickness of the wiring line pattern is uniform and sufficiently thin, that the n probes 1 are arranged in approximately even intervals, and that errors between the intervals are small, the resistances between the contact points or nodes of the probes 1 with the pad 7 are a constant value of r. Therefore, the resistances are equivalent to those of a pattern shown in FIG. 12B, that is, the case of the TEG 20 for contact resistance measurement shown in FIG. 7A. Thus, the measuring method described with reference to FIG. 7A can be applied.

Seventh Embodiment

FIG. 13 shows a pad 8 for resistance measurement which is a large area wiring line pattern. The wide area of semiconductor wafer 9 is covered with a conductive film and this conductive film is used as a pad 8 for resistance measurement. When a wafer on which a wiring line material of a low resistance is formed is used, the contact resistance of all the n probes 1 can be measured for the same reason as the sixth embodiment. If the probe unit of the n probes 1 ($n \geq 3$) is smaller than the size of semiconductor wafer 9, it is possible to measure the contact resistance of the probe 1. In the neighborhood of the large area wiring pattern, the resistance measured between two adjacent probes 1 is strictly the resistance varies depending on a distance from the wafer end. However, an error is negligible.

Eighth Embodiment

Figure 14:
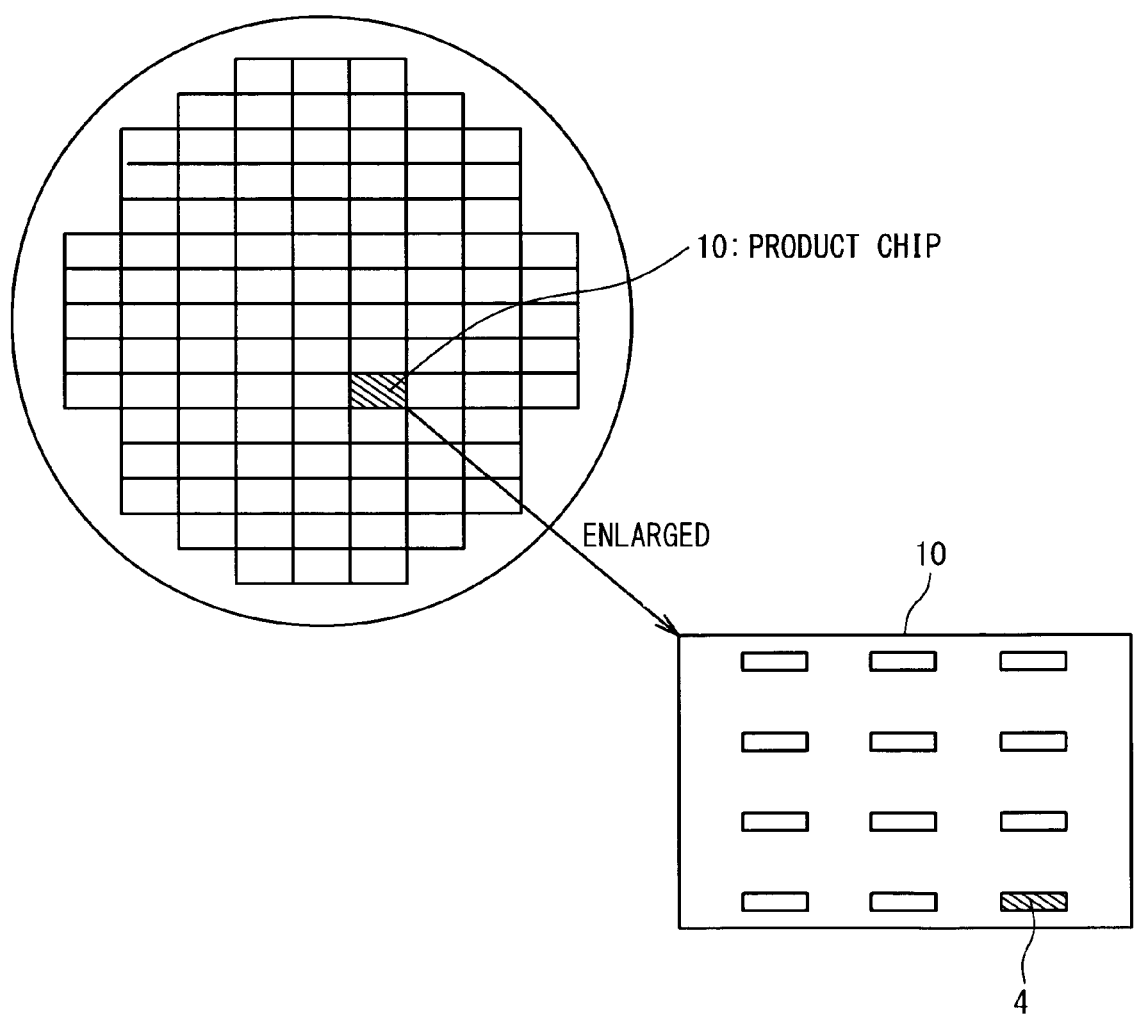
FIG. 14 is a diagram showing a layout of a product chip to which the TEG with a TEG for contact resistance measurement is applied.

FIG. 14 shows a layout of a product chip 10 to which the TEG 4 with the TEG 20 for contact resistance measurement is applied. As shown in FIG. 14, the TEG 4 with the TEG 20 for contact resistance measurement is laid out in advance in one or more of all the product chips 10 of the wafer. After the contact resistances of the probes 1 by using the TEG 20 for contact resistance measurement which is contained in one product chip 10 based on the method of the previously mentioned embodiment, the evaluation of the product chip 10 by using the probes 1 is performed. Thus, it is possible to evaluate the product chip 10 without being influenced by the contact resistances of probes 1.

Measuring the contact resistances of probes 1 in the plurality of positions of the wafer surface by using either of the methods in the first embodiment to the eighth embodiment, it is possible to determine a distribution of the contact resistance of probes 1 due to the difference in the needle pressure which is depends on the position of the wafer surface.

Ninth Embodiment

Figure 15A:
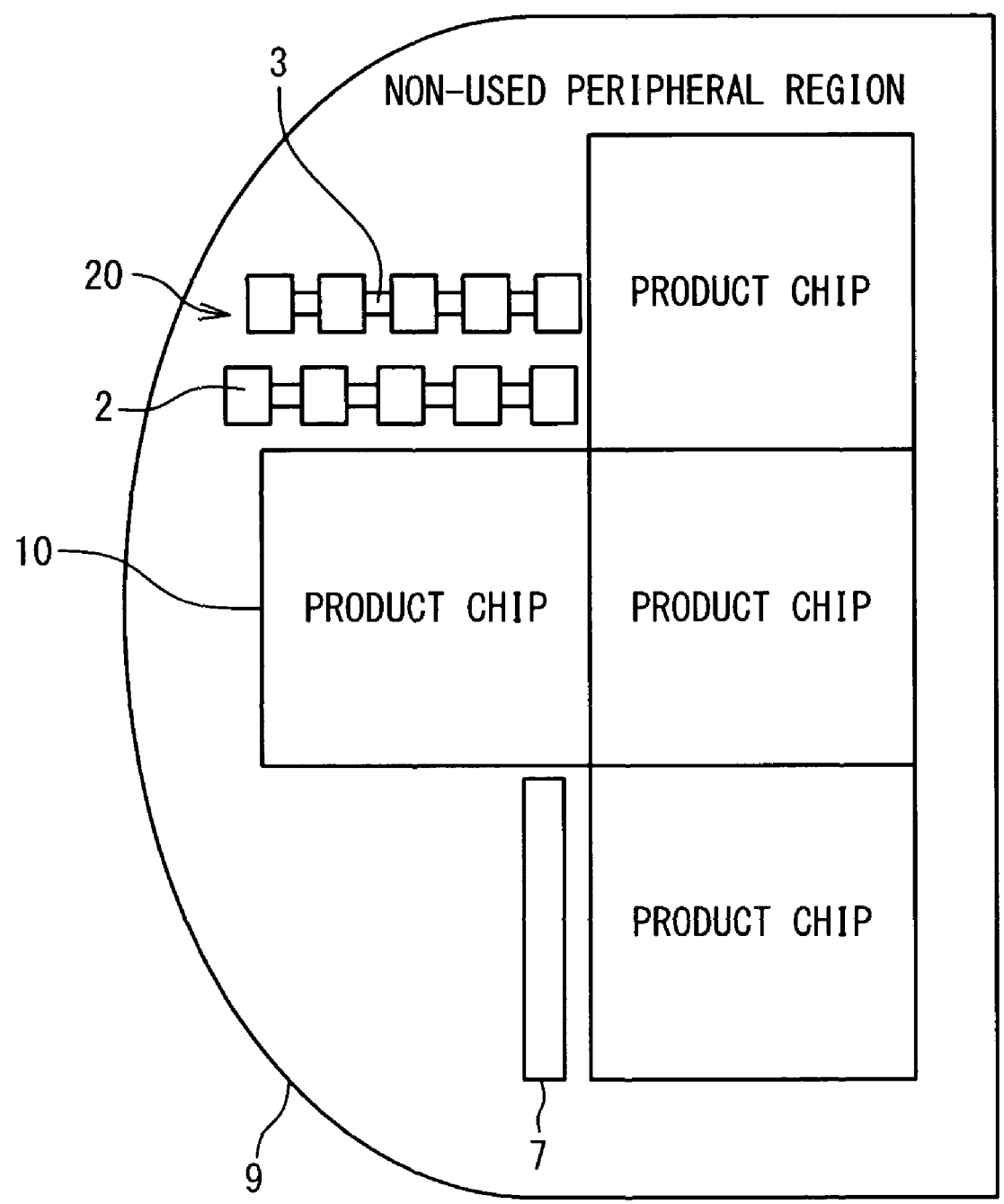
FIG. 15A is a diagram showing a structure example to measure the contact resistance of a probe, by using an unused area such as a peripheral portion of a product.

FIG. 15A shows the structure to measure the contact resistance of the probe 1, by utilizing unused areas such as a peripheral portion of the product effectively. FIG. 15A shows only a part of the peripheral portion of the wafer for convenience. However, a pattern of pads for contact resistance measurement may be arranged in advance over the whole peripheral portion. Like FIG. 15A, By preparing the pad 7 for resistance measurement as a linear-shape wiring line pattern or the TEG 20 for contact resistance measurement in the unused area such as the peripheral portion of the product on wafer 9, the contact resistances of the probes 1 can be measured in the same way as in the sixth embodiment.

Figure 15B:
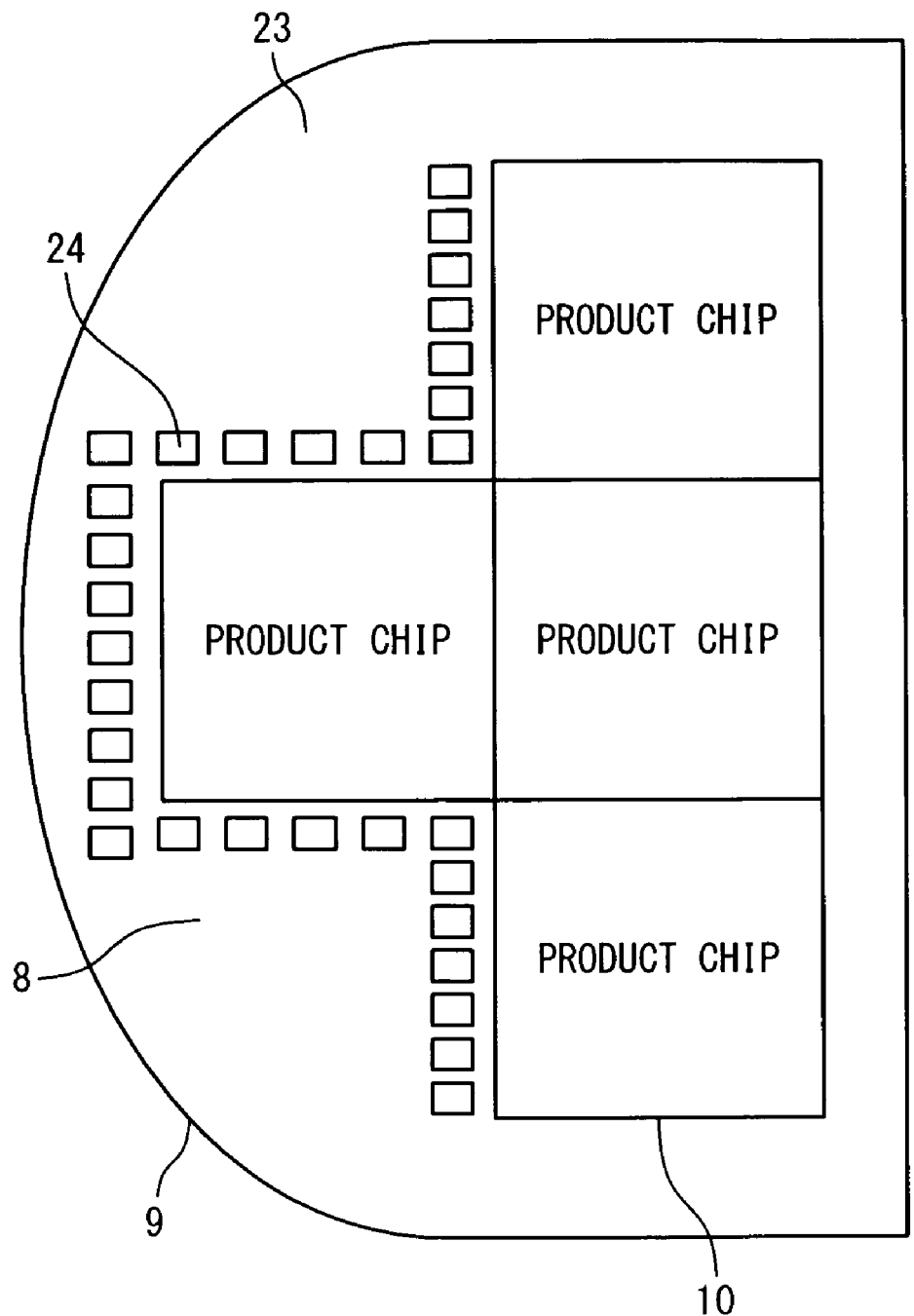
FIG. 15B is a diagram showing another structure example to measure the contact resistance of a probe, by using an unused area such as a peripheral portion of a product.

As the application example shown in FIG. 15B, a conductive film is formed in the unused areas such as the peripheral portion of the product at the same time as a top wiring layer and is covered with an insulating film 23, and a part of the conductive film is exposed by forming windows 24. By using the conductive film part as the pads 8 for resistance measurement, the contact resistances of the probes 1 can be measured. As shown by this example, the insulating film 23 is formed on the uppermost conductive film in all of the pads 7 for resistance measurement as the linear wiring line pattern, the TEG 20 for contact resistance measurement, and the pad 8 for resistance measurement as a large area wiring pattern, to protect those patterns. Thus, by forming the window 24, the area as a node can be exposed and formed.

[Arrangement of Pad for Resistance Measurement]

Next, an embodiment of arraigning pads for resistance measurement will be described. Actually, when TEGs in a semiconductor product should be designed, it is intended to produce a large number of kinds of TEGs in an area for the TEG. For this reason, it is often difficult to prepare an exclusive area for the pads for resistance measurement.

Therefore, by arranging the pads for resistance measurement in the area where the TEGs for device electric characteristic evaluation cannot be arranged, it is possible to easily arrange the pads for resistance measurement as a part of the attachment TEGs of the semiconductor product. Such an area is an area of a lower layer pattern such as an alignment pattern, especially, which is positioned on scribe lines and is formed through synthesis of the adjacent exposure fields, in the end portion of a region formed through one exposure step (to be referred to as an exposure field) when the exposure step is performed by using a reduced projection type exposing apparatus.

According to the present embodiment, the area of the alignment pattern can be used which is necessarily arranged in any kind of semiconductor product. Therefore, it is possible to arrange the pads for resistance measurement as a part of the attachment TEGs in any semiconductor product, with no relation to the area size for the attachment TEGs.

Hereinafter, the arrangement of such a pad for resistance measurement will be described in detail. The arrangement of the pads for resistance measurement can be applied to each of the previously mentioned first to ninth embodiments in a range where any contradiction is not caused. It should be noted that the following embodiment will be described by using the TEG 20 for contact resistance measurement of the pads for resistance measurement. However, the pads may be the pads 7 for resistance measurement as the linear wiring line pattern, or the pad 8 for resistance measurement as the large area wiring pattern.

Tenth Embodiment

The TEG 20 for contact resistance measurement may be formed in an upper layer of the lower layer pattern area to overlap in at least a part, if one of the TEG 20 and the lower layer pattern area which has been formed before the TEG 20 does not influence to the other. As the lower layer pattern area are exemplified pattern areas associated with alignment such as an alignment reference position measurement pattern and an alignment error measurement pattern, pattern areas associated with step monitoring such as a size measurement pattern and a film thickness measurement pattern, and pattern areas associated with TEGs such as TEGs for device electric characteristics evaluation.

Figure 16A:
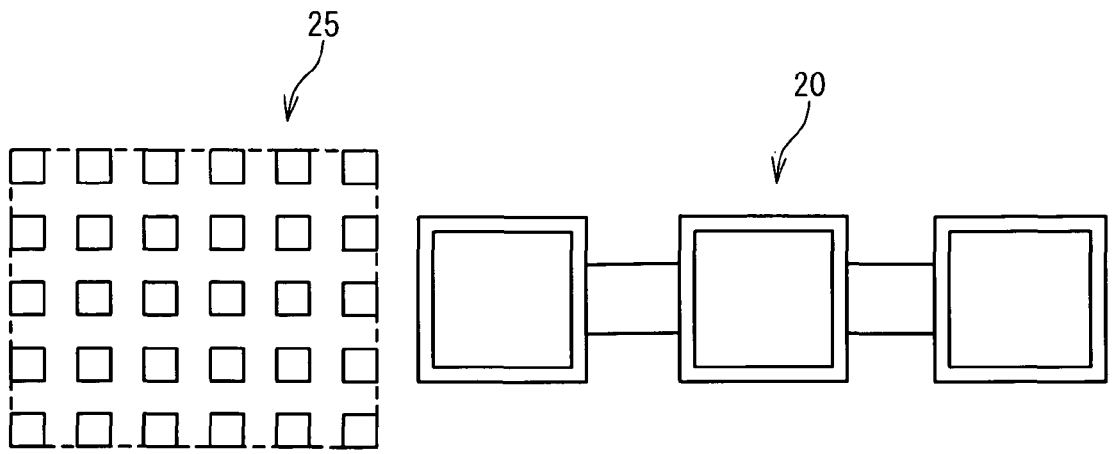
FIG. 16A is a diagram showing a structure in which the TEG for contact resistance measurement is formed not to overlap with a lower layer pattern area in a height direction.
Figure 16B:
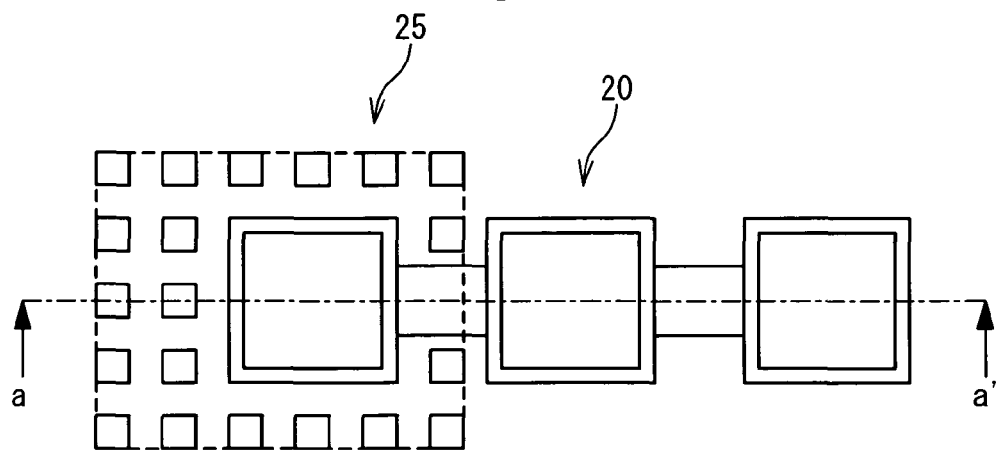
FIG. 16B is a diagram showing a structure in which the TEG for contact resistance measurement is formed to overlap with the lower layer pattern area in the height direction.
Figure 16C:
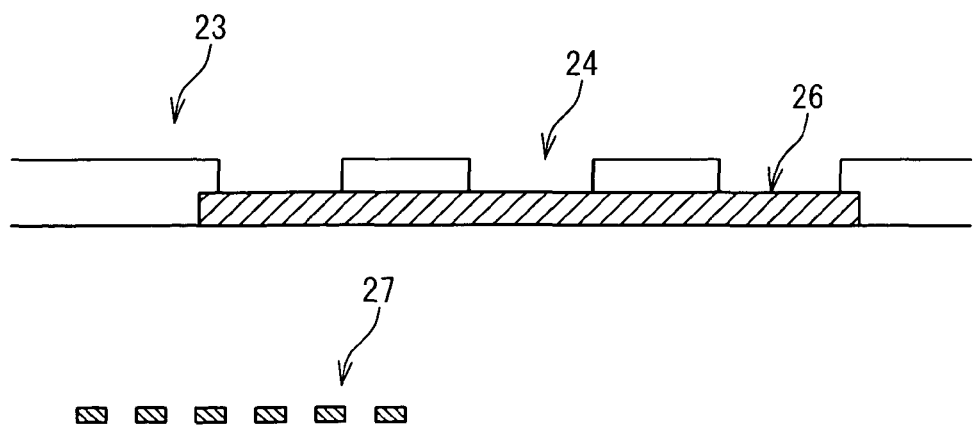
FIG. 16C is a diagram showing a conductive pattern containing a part of the TEG for contact resistance measurement and a lower layer pattern as a part of a lower layer pattern area.

One example is shown in FIGS. 16A, 16B, and 16C. FIG. 16C is a cross sectional view along the line a-a' of FIG. 16B. FIG. 16A shows a case that the TEG 20 for contact resistance measurement is formed not to overlap with the lower layer pattern area 25 in a height direction.

FIG. 16B shows a case that the TEG 20 for contact resistance measurement is formed to overlap with the lower layer pattern area 25 in the height direction. In this case, FIG. 16C shows a conductive pattern 26 which is a part of the TEG 20 for contact resistance measurement and a lower layer pattern 27 which is a part in the lower layer pattern area 25. The conductive pattern 26 has a flat surface with no relation to the position of which the upper layer of the lower layer pattern area 25 overlaps. Like this example, if one of the TEG 20 for contact resistance measurement and the lower layer pattern area 25 which has been formed before the TEG 20 does not adversely influence to the other, the TEG 20 for contact resistance measurement may be formed above the lower layer pattern area 25 to overlap with a part of the lower layer pattern area 25. It should be noted that FIG. 16C shows an example in which the windows 24 are formed by forming the insulating film 23 above the TEG 20 for contact resistance measurement and removing the insulating film 23 from areas for the pads to which the probes 1 are made contact.

As the lower layer pattern area 25 shown in FIG. 16B are exemplified pattern areas such as an alignment related pattern area, a step monitor related pattern area and a TEG related pattern area. The alignment related pattern area is pattern areas used in a lithography step such as the alignment reference position measurement pattern and the alignment error measurement pattern. The step monitor related pattern area is pattern areas such as the size measurement pattern, and the film thickness measurement pattern. The TEG related pattern area is the pattern areas of the semiconductor circuit provided to perform the device electric characteristic evaluation.

The above-mentioned alignment related pattern includes a pattern group formed based on the arrangement and combination of the plurality of element pattern. The phrase "pattern area" shows an area of the whole pattern group.

When the TEG for the contact resistance measurement is formed to overlap with the lower layer pattern area, a case that one of them influences to the other at least will be thought of. (1) When the measurement of the alignment related pattern becomes impossible, by forming the TEG above the alignment related pattern used in a lithography process to form an opening of a passivation film on the pad, the use purpose of the lower layer pattern is not achieved. (2) When the surface of the conductive pattern of the TEG for contact resistance measurement becomes not flat by forming above the lower layer pattern with a step so that measurement precision is degraded, the use purpose of the TEG for contact resistance measurement is not achieved.

It is desirable to arrange the TEG for contact resistance measurement on the position on which these adverse influences can be avoided.

As shown in FIGS. 16B and 16C, the TEG 20 for contact resistance measurement is suitable if the TEG 20 for contact resistance measurement is formed above the lower layer pattern area 25 which is not used after the TEG 20 is formed, to overlap with the lower layer pattern area 25 in the height direction, and the conductive pattern 26 of the TEG 20 for contact resistance measurement has a flat surface so that the surface does not the adverse influence measurement precision.

Eleventh Embodiment

The TEG 20 for contact resistance measurement may be formed by using plural times of the exposure process. By the exposure of the plurality of number of times, a part of the TEG 20 for contact resistance measurement may be exposed plural times. Through this multiple exposure, the part of TEG 20 for contact resistance measurement may be transformed.

Figure 17A:
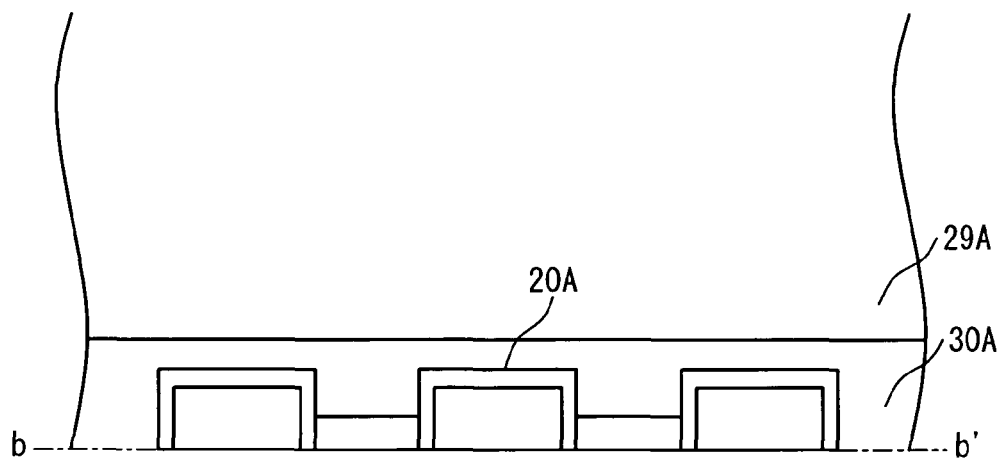
FIGS. 17A and 17B are schematic diagrams showing lower and upper portions in an exposure field when an exposure process is performed by using a reduced projection type exposure apparatus, respectively.

FIGS. 17A to 17F show an example. For example, FIG. 17A is a schematic diagram showing a lower portion in the exposure field when the exposure process is performed by using a reduced projection type exposure apparatus. The line b-b' shows a centerline in the scribe line area. An upper portion of the TEG 20A for contact resistance measurement is formed on the scribe line area 30A in the exposure field lower portion adjacent to a product area 29A.

Figure 17B:
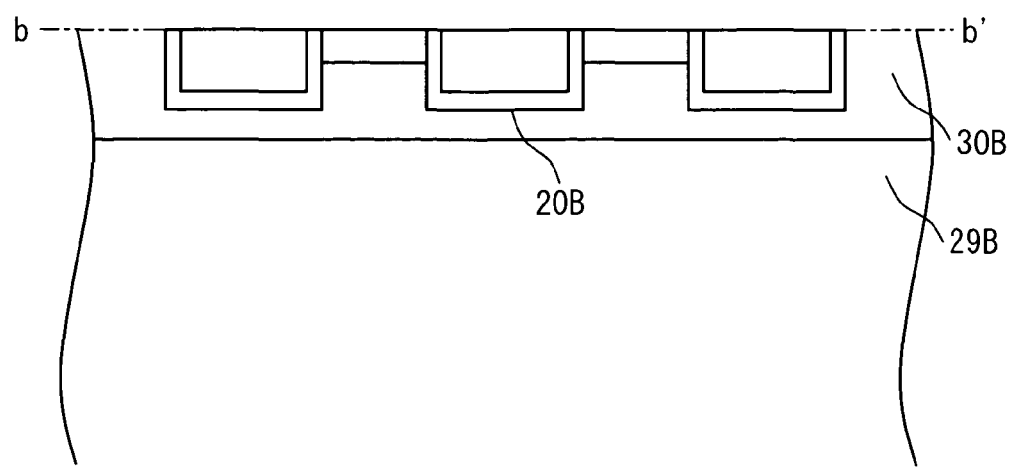

FIG. 17B is a schematic diagram showing a lower portion in the exposure field, similar to FIG. 17A. The line b-b' shows the centerline in the scribe line area. A lower portion of the TEG 20B for contact resistance measurement is formed on the scribe line area 30B in the exposure field upper portion adjacent to a product area 29B.

Figure 17C:
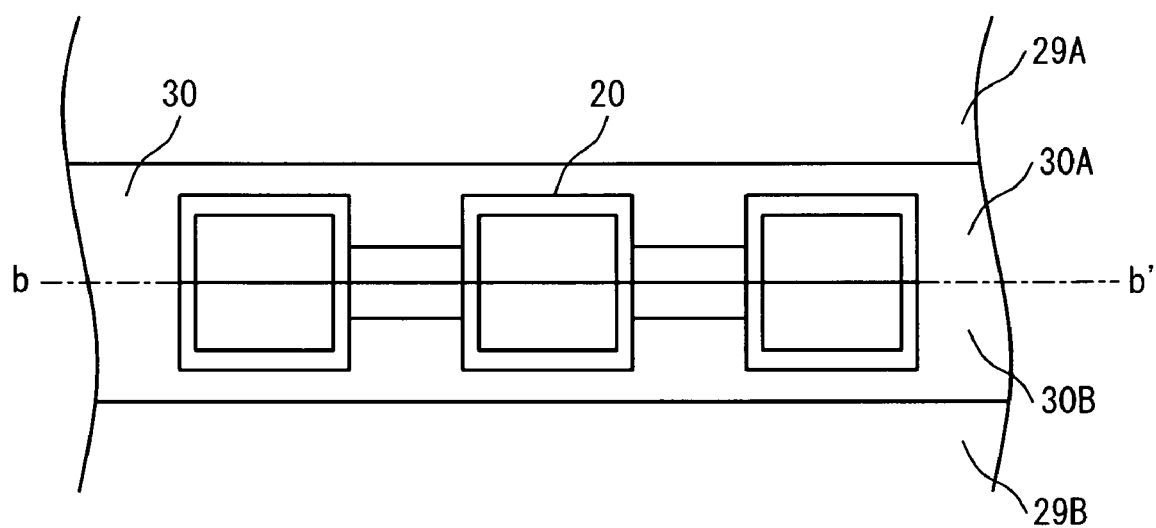
FIG. 17C is a diagram showing the TEG for contact resistance measurement formed in a boundary of adjacent exposure fields.

FIG. 17C shows the TEG 20 for contact resistance measurement formed when the sections shown in FIGS. 17A and 17B are arranged adjacently. The line b-b' shows the centerline in the scribe line area. In this TEG 20 for contact resistance measurement, the TEG 20A for the contact resistance measurement shown in FIG. 17A is formed in the lower portion in the topside area and the TEG 20B for contact resistance measurement shown in FIG. 17B is formed the upper portion in the underside area. The lines b-b' of FIG. 17A and 17B are coincident with the line b-b' of FIG. 17C.

For example, FIG. 17C shows a boundary section in adjacent exposure fields when exposure is performed by using the reduced projection type exposure apparatus while shifting a wafer at a predetermined pitch defined based on the size of the exposure field. The scribe line area 30A in the exposure field lower portion and the scribe line area 30B in the exposure field upper portion are synthesized to form the scribe line area 30. Also, the TEG 20A for contact resistance measurement and the TEG 20B for contact resistance measurement are synthesized to form the TEG 20 for contact resistance measurement. In this way, the TEG for contact resistance measurement may be formed by using the exposure process plural times.

Figure 17D:
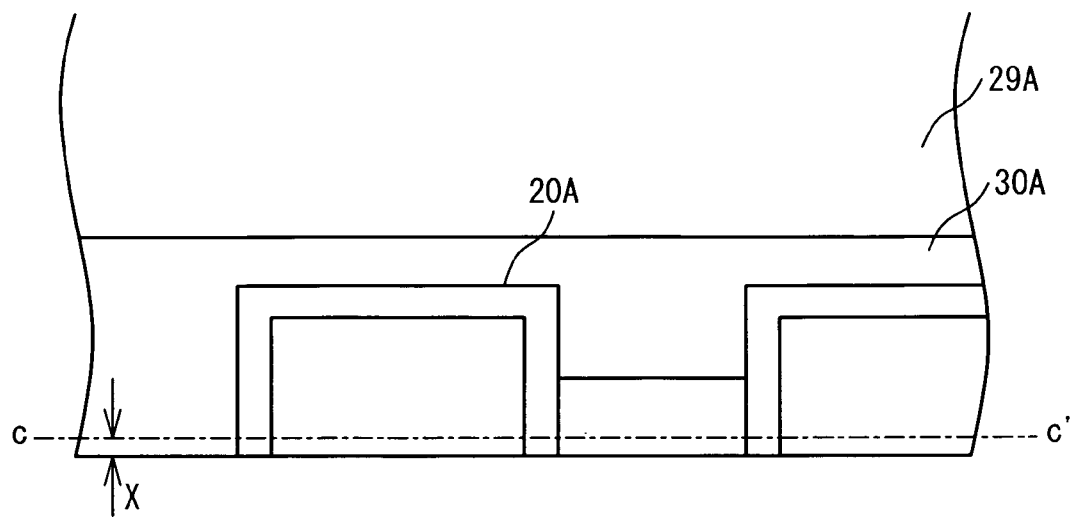
FIGS. 17D and 17E are diagrams showing exposure field upper and lower portions in the TEG for contact resistance measurement, respectively.
Figure 17E:
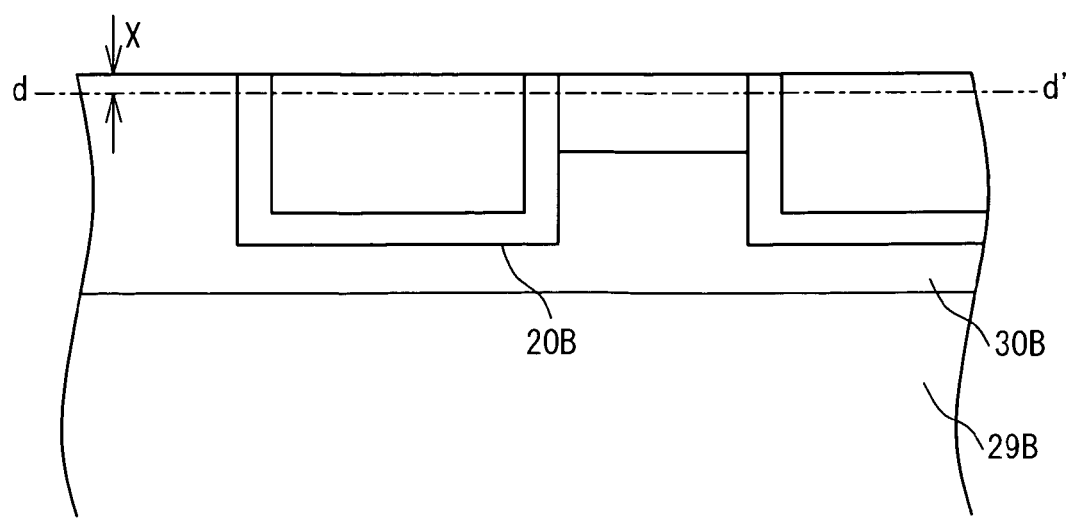

Through the exposure process plural times, there is a case that the TEG for the contact resistance measurement is deformed. Hereinafter, the deformation will be described. FIGS. 17D and 17E are detailed diagrams showing the upper and lower portions in the exposure field by expanding parts of FIGS. 17A and 17B, respectively. Here, the line c-c' and the line d-d' show a centerline in the scribe line area.

In FIGS. 17A and 17B, the upper and lower portions in the exposure fields are shown to be coincide with the centerline in the scribe line area shown by the line b-b'. However, as shown in FIGS. 17D and 17E, usually, the lower and upper portions in the exposure fields extend over by X from the center of the scribe line area shown by the line c-c' and the line d-d'. The lower and upper portions in the exposure field overlap by 2X in the exposure fields.

This overlap is provided by the following reason. That is, when the exposure is performed by using the reduced projection type exposure apparatus in order while shifting a wafer in the predetermined pitch defined based on the size of the exposure field, it is generally difficult to make a boundary section of the adjacent exposure fields correctly coincide. This is because of error factors such as an optical error of the exposure field size copied onto the wafer, a mechanical error when shifting the wafer, and a size error due to the deformation of the wafer. Therefore, there is a possibility that an un-exposed portion is formed in the boundary section of adjacent exposure fields due to errors. The overlapping portions of the width X shown in FIGS. 17D and 17E are provided for the purpose to prevent such an unexposed portion.

Figure 17F:
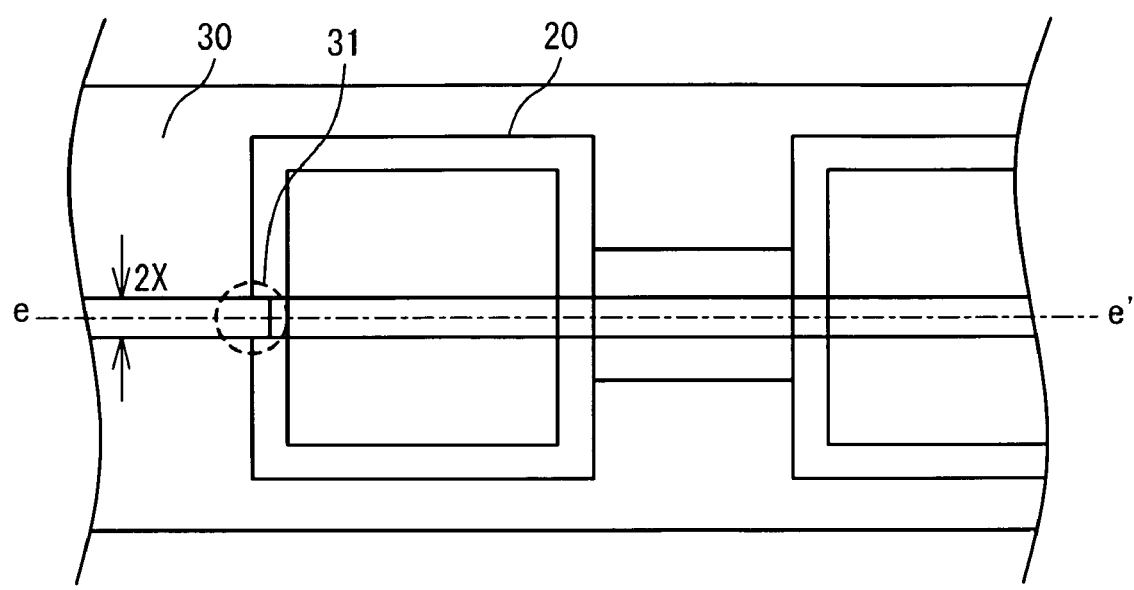
FIG. 17F is a diagram showing the TEG for contact resistance measurement formed in the boundary of adjacent exposure fields.

FIG. 17F shows the TEG 20 for contact resistance measurement when the upper and lower portions in the exposure field shown in FIGS. 17D and 17E are overlapped. The line e-e' shows the centerline of the scribe line area. The line e-e' is almost coincident with the line c-c' and line d-d'.

The portions by the width X extending from the center of the scribe line areas shown by the line c-c' and the line d-d' overlap with each other in the upper and lower portions in the exposure field. As a result, the multiple exposure portion with the width 2X is formed in the center of the scribe line area. In the TEG 20 for contact resistance measurement formed by synthesizing the TEG 20a for contact resistance measurement and the TEG 20B for contact resistance measurement synthesized, the multiple exposure portion with the width 2X is formed.

Generally, the multiple exposure portion receives more energy in a photoresist layer compared than a usual portion. Therefore, there is a case that a photoresist layer is transformed, depending on a condition in a photolithography process. Deformation is immediately transferred to the inner or outer pattern direction if the deformation of the photoresist layer is caused in the end of the pattern, and the deformation may be copied into a pattern on the wafer through the photolithography. FIG. 17F shows a deformation area 31 shows the pattern of a pad deformed through the multiple exposure.

On the other hand, the wiring line portion which connects a pad and a pad in FIG. 17F is not deformed. For example, when a pad and a connection wiring line are formed of a same wiring line material, the wiring line which connects a pad and a pad is not a pattern end even if it is a multiple exposure portion. Therefore, the deformation of the photoresist layer is deformation into a direction of film thickness so that the photoresist layer becomes thin. Thus, it is possible to form the photoresist layer so as for a pattern itself on the wafer not to be deformed even if the film thickness of the photoresist layer is influenced. In this case, because the shape of the wiring line material in the connection wiring line portion is not deformed, there is not an influence to the wiring resistance and the adverse influence is not in the measurement precision of the TEG 20 for contact resistance measurement.

As shown in the eleventh embodiment, a part of the TEG 20 for contact resistance measurement may receive multiple exposures. Also, if the adverse influence is not in the measurement precision, the part of the TEG 20 may be deformed through the multiple exposures.

Twelfth Embodiment

The TEG 20 for contact resistance measurement may be formed on both of the scribe line areas in a horizontal direction and a vertical direction.

Figure 18:
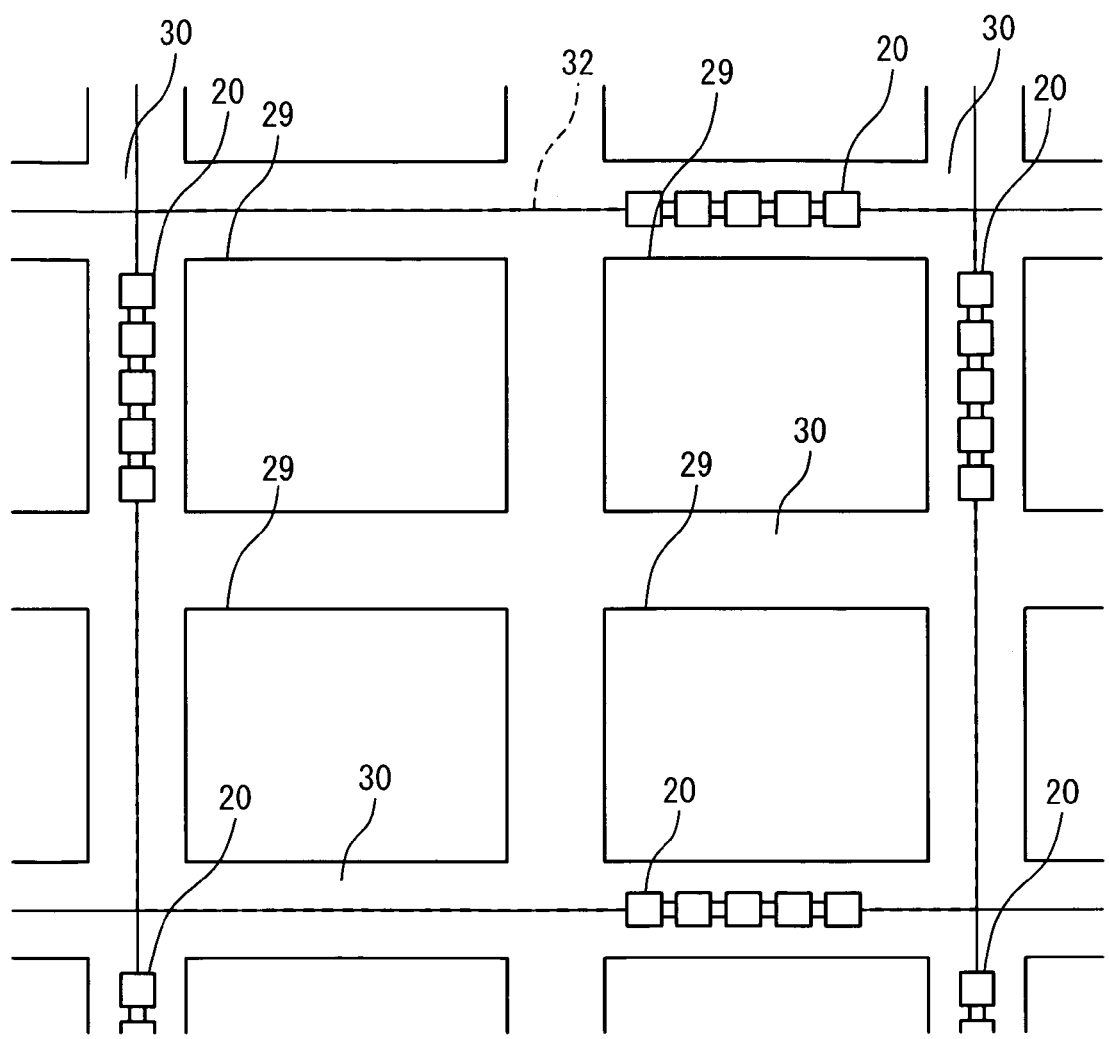
FIG. 18 is a diagram showing the TEG for contact resistance measurement formed on scribe line areas in horizontal and vertical directions.

FIG. 18 shows an example. Four product areas 29 are formed in one exposure field 32. A scribe line area 30 is formed between the adjacent product areas 29. Such an exposure field 32 is periodically formed in a constant pitch.

In the boundary section of the exposure field 32, the scribe line areas 30 are synthesized from the adjacent exposure fields. Also, the TEG 20 for contact resistance measurement is synthesized. The TEG 20 for contact resistance measurement is formed on the scribe line areas extending in the horizontal direction and in the vertical direction.

There is a case that various types of TEGs of device electric characteristic evaluation are arranged in the scribe line areas in the horizontal and vertical directions. In such a case, when both of the TEGs on the scribe line area in the horizontal direction and the TEGs on the scribe line area in the vertical direction are used for measurement by using the probe unit of a plurality of probes, it is necessary to rotate the wafer on a wafer stage by 90 degrees. Generally, the orientation of the wafer is changed by setting again. In case that the an axis of the wafer stage is inclined, the probe contact resistance is different due to the difference in needle pressure, between a case of the measurement of the TEGs in the horizontal direction and a case of the measurement of the TEGs in the vertical direction after the rotation. Therefore, there is a possibility to be caused an error.

To solve this problem, it is desirable to arrange at least one TEG 20 for contact resistance measurement in the horizontal direction and at least one other TEG 20 for contact resistance measurement in the vertical direction, so that the probe contact resistance can be checked even in any orientation of the wafer.

By combining the tenth embodiment and the eleventh embodiment, and providing the TEG 20 for contact resistance measurement above the alignment related pattern area which is arranged in the boundary section of the exposure fields 32, this problem can be solved. The alignment related pattern areas are always arranged in the horizontal and vertical directions even in any semiconductor product. Therefore, the TEG 20 for contact resistance measurement can be arranged in the horizontal and vertical directions, by using these pattern areas. Also, as shown in this twelfth embodiment, the TEG 20 for contact resistance measurement may be arranged on the scribe line areas in the horizontal and vertical directions.

According to the present invention, by providing a wiring line pattern or a TEG in which three or more pads are connected in series with low resistance wiring lines on an evaluation wafer or a product wafer, a contact resistance every each probe can be measured. In a test and sort process of a product wafer and a device electric characteristic evaluation, the contact resistance and the state of the probe can be surely confirmed easily. As an example, in an ON current of a MOSFET which is conspicuously influenced due to the contact resistance can be measured without an error.

Also, according to the present invention, the contact resistance of each probe can be measured and the current of the device can be precisely measured.

Moreover, according to the present invention, by measuring the contact resistance of each probe, the probe can be determined. The measurement in a high precision becomes possible even if there is a contact resistance of about 10Ω, which cannot be measured in the related art.

In addition, by recording a contact resistance change of all the probes every time of the measurement, the maintenance and management of the probe unit become possible. Besides, the measurement in a high precision becomes possible in characteristic evaluation in a high temperature, a normal temperature, and a cold temperature, by measuring the contact resistance of the probe every temperature and monitoring a temperature.

Although the present invention has been described above in connection with several preferred embodiments thereof, it would be apparent to those skilled in the art that those embodiments are provided solely for illustrating the present invention, and should not be relied upon to construe the appended claims in a limiting sense.

What is claimed is:

1. A semiconductor device with pads for probe resistance measurement, comprising:
   three or more pads electrically isolated from a semiconductor circuit formed on a semiconductor substrate;
   wiring lines provided to connect between said pads in series and having a same resistance; and
   at least one of an alignment related pattern used to measure an alignment reference position of said semiconductor circuit and an alignment error when said semiconductor circuit is formed on said semiconductor substrate, a step monitor related pattern used to measure a size or a thickness, or said semiconductor circuit,
   wherein said three or more pads are arranged in an area where said alignment related pattern, said step monitor related pattern or said semiconductor circuit is formed.

* * * * *